United States Patent
Abdo et al.

(10) Patent No.: US 10,171,077 B2
(45) Date of Patent: Jan. 1, 2019

(54) SCALABLE QUBIT DRIVE AND READOUT

(71) Applicant: INTERNATIONAL BUSINESS MACHINES CORPORATION, Armonk, NY (US)

(72) Inventors: Baleegh Abdo, Carmel, NY (US); Jerry M. Chow, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/492,812

(22) Filed: Apr. 20, 2017

(65) Prior Publication Data

US 2018/0091141 A1 Mar. 29, 2018

Related U.S. Application Data

(62) Division of application No. 15/275,513, filed on Sep. 26, 2016, now Pat. No. 9,735,776.

(51) Int. Cl.
*H03F 19/00* (2006.01)
*H03K 17/92* (2006.01)
*G06N 99/00* (2010.01)

(52) U.S. Cl.
CPC ........... *H03K 17/92* (2013.01); *G06N 99/002* (2013.01)

(58) Field of Classification Search
CPC ........... H03K 17/19; H05F 1/42; H01F 19/00; H01F 15/00; G06N 99/002
USPC .......................................... 327/528; 326/1–3
See application file for complete search history.

(56) References Cited

U.S. PATENT DOCUMENTS

| | | | |
|---|---|---|---|
| 4,458,160 | A | 7/1984 | Josephs et al. |
| 7,220,954 | B2 | 5/2007 | Kuzmich et al. |
| 7,667,853 | B2 | 2/2010 | Ichimura et al. |
| 8,169,231 | B2 | 5/2012 | Berkley |
| 8,294,138 | B2 | 10/2012 | Farinelli et al. |
| 8,854,074 | B2 | 10/2014 | Berkley |
| 8,922,239 | B2 | 12/2014 | Pesetski et al. |
| 9,680,452 | B1 * | 6/2017 | Abdo ............ H03K 3/38 |
| 9,692,423 | B2 * | 6/2017 | McDermott, III ........... H03K 19/1954 |
| 9,735,776 | B1 | 8/2017 | Abdo et al. |
| 2008/0048762 | A1 | 2/2008 | Inamdar et al. |
| 2013/0043945 | A1 | 2/2013 | McDermott |
| 2016/0156356 | A1 | 6/2016 | Bronn et al. |
| 2016/0156357 | A1 | 6/2016 | Miller et al. |

(Continued)

FOREIGN PATENT DOCUMENTS

GB 2358932 A 8/2001

OTHER PUBLICATIONS

Baleegh Abdo et al., "Scalable Qubit Drive and Readout", U.S. Appl. No. 15/275,513, filed Sep. 26, 2016.

(Continued)

*Primary Examiner* — Dinh T Le
(74) *Attorney, Agent, or Firm* — Cantor Colburn LLP; Vazken Alexanian

(57) ABSTRACT

A technique relates to qubit drive and readout. A first lossless microwave switch is connected to a quantum system. A second lossless microwave switch is connectable to the first lossless microwave switch. A quantum-limited amplifier is connectable to the second lossless microwave switch.

17 Claims, 22 Drawing Sheets

(56) References Cited

U.S. PATENT DOCUMENTS

2016/0308502 A1 10/2016 Abdo et al.
2017/0091647 A1* 3/2017 Abdo .................... G01V 8/005

OTHER PUBLICATIONS

List of IBM Patents or Patent Applications Treated as Related; (Appendix P), Filed May 15, 2017; 2 pages.
Barends et al., "Logic Gates at the Surface Code Threshold: Superconducting Qubits Poised for Fault-Tolerant Auantum Computing," Nature 508, 500, 2014, pp. 1-15.
Chapman et al., "General Purpose Multiplexing Device for Cryogenic Microwave Systems," arXiv:1603.02716v2, 2016, pp. 1-10.
Chen et al., "Multiplexed Dispersive Readout of Superconducting Phase Qubits," Applied Physics Letters 101, 182601, 2012, pp. 1-4.
Jerger et al., Frequency Division Multiplexing Readout and Simultaneous Manipulation of an Array of Flux Qubits, Applied Physics Letters 101, 042604, doi: 10.1063/1.4739454, 2012, pp. 1-5.
Leek et al., "Cavity Quantum Electrodynamics with Separate Photon Storage and Qubit Readout Modes," Physical Review Letters 104.10, Mar. 10, 2010, pp. 1-4.
PCT/IB2017/057005 International Search Report and Written Opinion, dated Feb. 24, 2018.

* cited by examiner

PROVIDE A FIRST LOSSLESS MICROWAVE SWITCH CONNECTED TO A QUANTUM SYSTEM, WHEREIN A FIRST INPUT IS CONNECTABLE TO THE FIRST LOSSLESS MICROWAVE SWITCH AND A QUANTUM-LIMITED AMPLIFIER IS CONNECTABLE TO THE FIRST LOSSLESS MICROWAVE SWITCH 2005

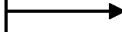

PROVIDE A SECOND LOSSLESS MICROWAVE SWITCH CONNECTED TO THE QUANTUM SYSTEM, WHEREIN A SECOND INPUT IS CONNECTABLE TO THE SECOND LOSSLESS MICROWAVE SWITCH, WHEREIN THE SECOND INPUT IS CONFIGURED TO DRIVE THE QUANTUM SYSTEM AND THE FIRST INPUT IS CONFIGURED TO READ OUT THE QUANTUM SYSTEM 2010

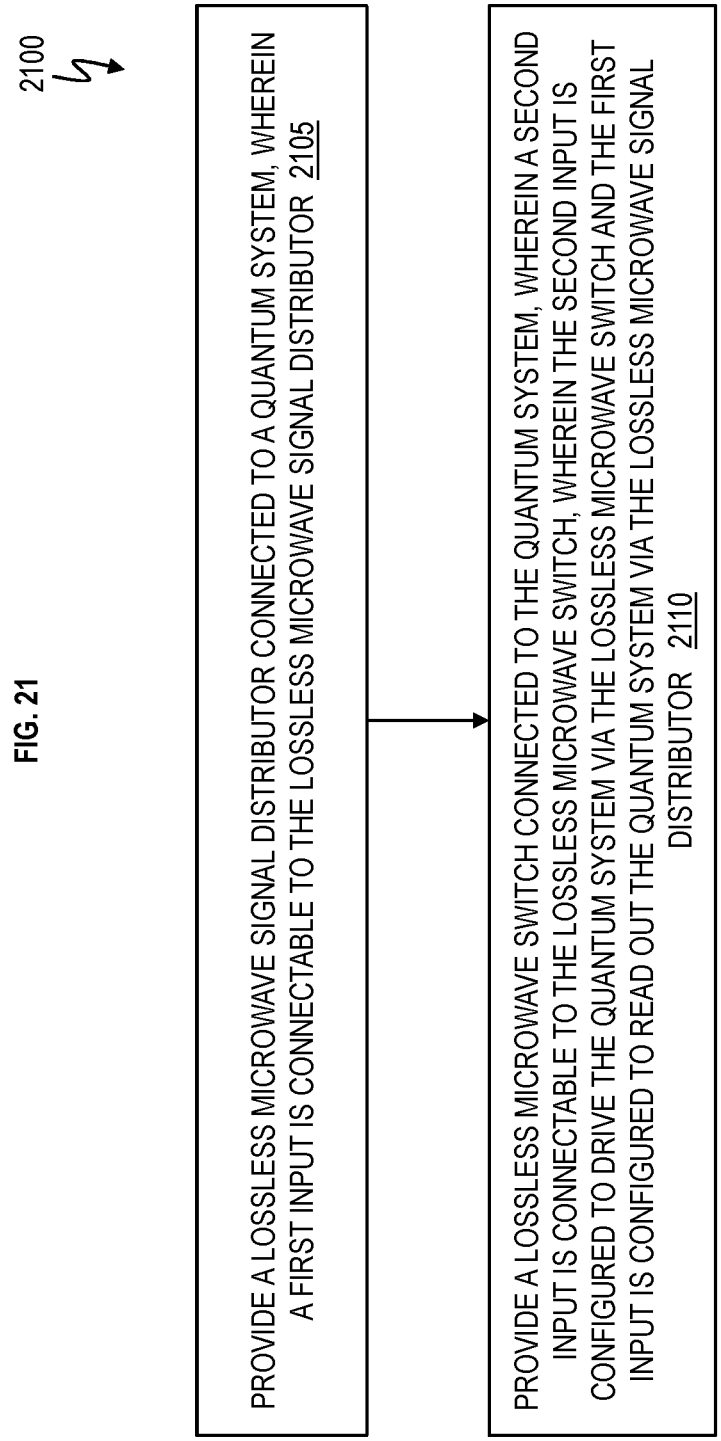

┌─────────────────────────────────────────┐
│ PROVIDE A LOSSLESS MICROWAVE SIGNAL     │
│ DISTRIBUTOR CONNECTED TO A QUANTUM      │
│ SYSTEM, WHEREIN A FIRST INPUT IS        │
│ CONNECTED TO THE LOSSLESS MICROWAVE     │
│ SIGNAL DISTRIBUTOR  2205                │
└─────────────────────────────────────────┘
                  │
                  ▼
┌─────────────────────────────────────────┐
│ PROVIDE A LOSSLESS MICROWAVE SWITCH     │
│ CONNECTED TO THE QUANTUM SYSTEM,        │
│ WHEREIN A SECOND INPUT IS CONNECTABLE   │
│ TO THE LOSSLESS MICROWAVE SWITCH,       │
│ WHEREIN THE SECOND INPUT IS CONFIGURED  │
│ TO DRIVE THE QUANTUM SYSTEM VIA THE     │
│ LOSSLESS MICROWAVE SWITCH  2210         │
└─────────────────────────────────────────┘
                  │
                  ▼
┌─────────────────────────────────────────┐
│ PROVIDE A LOSSLESS MICROWAVE SIGNAL     │
│ COMBINER CONNECTED TO THE QUANTUM       │
│ SYSTEM, WHEREIN THE FIRST INPUT IS      │
│ CONFIGURED TO READ OUT THE QUANTUM      │
│ SYSTEM VIA THE LOSSLESS MICROWAVE       │
│ SIGNAL DISTRIBUTOR AND THE LOSSLESS     │
│ MICROWAVE SIGNAL COMBINER  2215         │
└─────────────────────────────────────────┘
```

US 10,171,077 B2

SCALABLE QUBIT DRIVE AND READOUT

PRIORITY

This application is a divisional of U.S. Non-Provisional application Ser. No. 15/275,513, entitled "SCALABLE QUBIT DRIVE AND READOUT", filed Sep. 26, 2016, which is incorporated herein by reference in its entirety.

BACKGROUND

The present invention relates to superconducting electronic devices, and more specifically, a scalable qubit drive and readout scheme.

In circuit quantum electrodynamics, quantum computing employs nonlinear superconducting devices called qubits to manipulate and store quantum information at microwave frequencies, and resonators (e.g., as a two-dimensional (2D) planar waveguide or as a three-dimensional (3D) microwave cavity) to read out and facilitate interaction among qubits. As one example, each superconducting qubit can include one or more Josephson junctions shunted by capacitors in parallel with the junctions. The qubits are capacitively coupled to resonators (e.g., 2D or 3D microwave cavities).

SUMMARY

According to one or more embodiments, a system for qubit drive and readout is provided. The system includes a first lossless microwave switch connected to a quantum system, a second lossless microwave switch connectable to the first lossless microwave switch, and a quantum-limited amplifier connectable to the second lossless microwave switch.

According to one or more embodiments, a system for qubit drive and readout is provided. The system includes a first lossless microwave switch connected to a quantum system, in which a first input is connectable to the first lossless microwave switch and a quantum-limited amplifier is connectable to the first lossless microwave switch. Also, the system includes a second lossless microwave switch connected to the quantum system, in which a second input is connectable to the second lossless microwave switch. The second input is configured to drive the quantum system and the first input is configured to read out the quantum system.

According to one or more embodiments, a system for qubit drive and readout is provided. The system includes a lossless microwave signal distributor connected to a quantum system, in which a first input is connectable to the lossless microwave signal distributor. The system includes a lossless microwave switch connected to the quantum system, in which a second input is connectable to the lossless microwave switch. The second input is configured to drive the quantum system via the lossless microwave switch and the first input is configured to read out the quantum system via the lossless microwave signal distributor.

According to one or more embodiments, a system for qubit drive and readout is provided. The system includes a lossless microwave signal distributor connected to a quantum system, in which a first input is connected to the lossless microwave signal distributor. The system includes a lossless microwave switch connected to the quantum system, in which a second input is connectable to the lossless microwave switch. The second input is configured to drive the quantum system via the lossless microwave switch. Also, the system includes a lossless microwave signal combiner connected to the quantum system, in which the first input is configured to read out the quantum system via the lossless microwave signal distributor and the lossless microwave signal combiner.

BRIEF DESCRIPTION OF THE DRAWINGS

FIG. 20 is a flow chart of a method of configuring a system in FIG. 16 for qubit drive and readout according to one or more embodiments.

FIG. 21 is a flow chart of a method of configuring a system in FIG. 17 for qubit drive and readout according to one or more embodiments.

FIG. 22 is a flow chart of a method of configuring a system in FIG. 18 for qubit drive and readout according to one or more embodiments.

DETAILED DESCRIPTION

Figure 1:
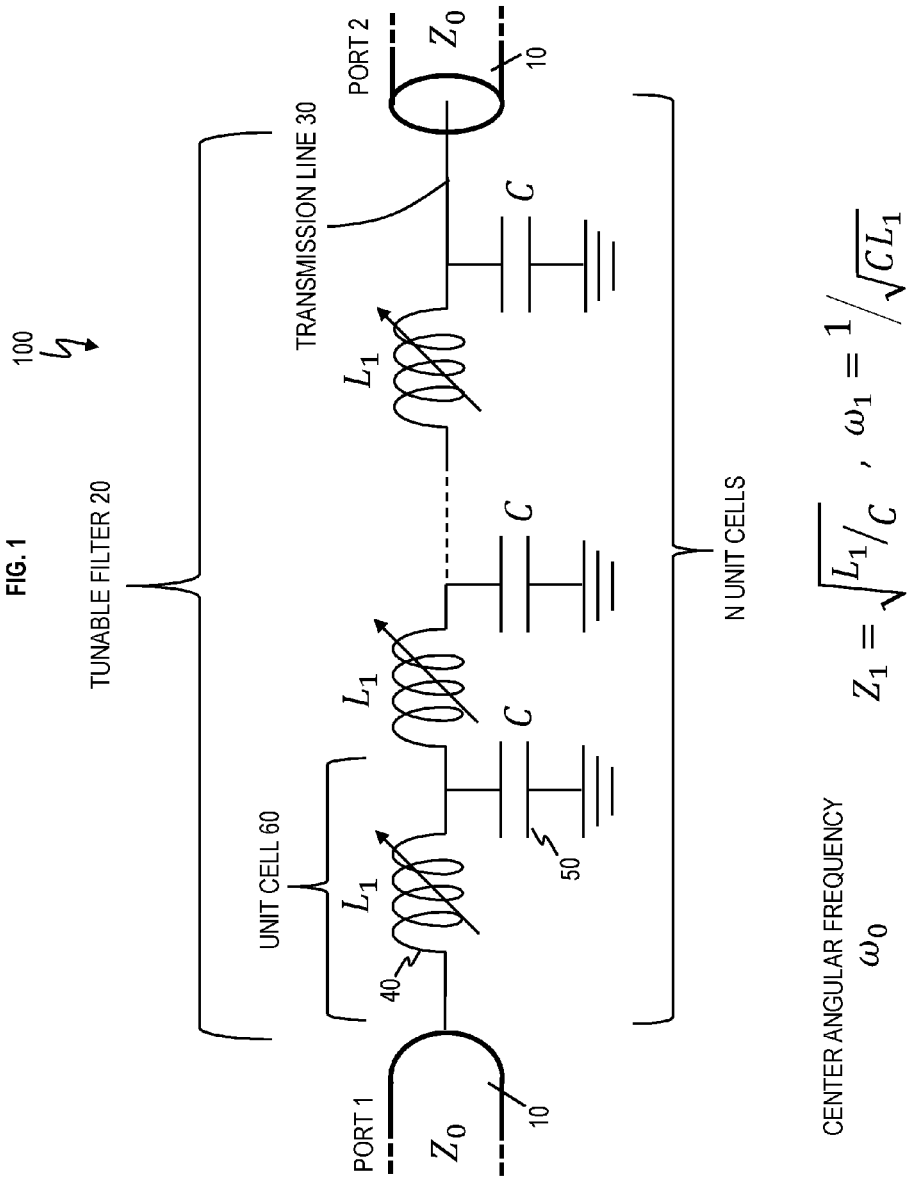
FIG. 1 is a schematic of a superconducting microwave switch/router according to one or more embodiments.

Various embodiments are described herein with reference to the related drawings. Alternative embodiments can be devised without departing from the scope of this document. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The electromagnetic energy associated with the qubit is stored in the Josephson junctions and in the capacitive and inductive elements forming the qubit. In one example, to read out the qubit state, a microwave signal is applied to the microwave readout cavity that couples to the qubit at the cavity frequency corresponding to the qubit state. Transmitted (or reflected) microwave signal goes through multiple thermal isolation stages and low-noise amplifiers that are required to block or reduce the noise and improve the signal-to-noise ratio. The microwave signal is measured at room temperature. A returned high microwave signal indicates that the qubit is in a high state and a low microwave signal indicates a low state. Microwave readout provides a stable signal amplitude for control, and commercial off-the-shelf (COTS) hardware is available to use that covers most of microwave frequency ranges.

Quantum systems such as superconducting qubits are very sensitive to electromagnetic noise, in particular in the microwave and infrared domains. In order to protect these quantum systems from microwave and infrared noise, several layers of filtering, attenuation, and isolation are applied. Of particular interest are the layers of protection employed on the input and output (I/O) lines, also called transmission lines, that are connected to the quantum system, and carry the input and output signals to and from the quantum system respectively. In the case of superconducting qubits, these I/O lines (transmission lines) are usually microwave coaxial lines or waveguides. Some of the techniques or components that are used in order to block or attenuate the noise propagating or leaking into these transmission lines are attenuators, circulators, isolators, low-pass microwave filters, bandpass microwave filters, and infrared filters which are based on lossy absorptive materials. However, these noise isolation components and microwave signal amplification techniques require a large amount of additional microwave hardware and cost.

Turning now to an overview of aspects of the present invention, in accordance with one or more embodiments, superconducting (or lossless) microwave switches/routers allow one to route quantum signals on demand between different nodes of a circuit or between different ports. Superconducting microwave switches can have many applications in the area of quantum information processing. For example, superconducting microwave switches can be utilized for time-multiplexed readout, time-multiplexed driving (e.g., cross-resonance drives), time-multiplexed characterization of several devices, time-multiplexed interaction between pairs of quantum systems, time-dependent circulation of signals, etc.

According to one or more embodiments, a superconducting microwave switch that can have one input port and N output ports is provided. Also, the superconducting microwave switch can have one output port and N input ports. Each of the ports of the superconducting microwave device is designed to have the same characteristic impedance $Z_0$. In one implementation, each input-output pair is connected through a tunable low-pass filter whose cutoff frequency can be tuned in-situ using applied magnetic flux. The tunable low-pass filter can be implemented using a ladder of series inductive elements (e.g., direct current (DC) superconducting quantum interference devices (SQUIDs)) and shunt capacitive elements (e.g., lumped-element capacitors). In another implementation, each input-output pair can be connected through a tunable high-pass filter whose cutoff frequency can be tuned in-situ using applied magnetic flux, and the tunable high-pass filter can be implemented using series capacitive elements (e.g., lumped-element capacitors) and shunt inductive elements (e.g., DC-SQUIDs).

Turning now to a more detailed description of aspects of the present invention, FIG. 1 is a schematic diagram of a superconducting microwave switch/router 100 according to one or more embodiments. FIG. 1 illustrates building blocks of the superconducting microwave switch/router 100 based on a tunable filter 20. In this example, the tunable filter 20 is a tunable low-pass filter (TLPF). However, it should be appreciated that embodiments are not limited to low-pass filters as discussed further below.

In this example, the microwave switch/router 100 includes ports 10, such as for example, ports 1 and 2. The ports 10 are input and output ports. The tunable filter 20 includes one or more unit cells 60. Each unit cell 60 includes a variable inductor 40 designated as variable inductive element $L_1$ (and other examples include $L_2$, $L_3$, and DC-SQUIDs discussed further below), and each unit cell 60 includes a capacitor 50 designated as capacitive element C. In each unit cell 60, the variable inductor $L_1$ 40 is connected in series with ports 10, and a capacitor C 50 is connected to one end of the variable inductor 40 and to ground. There can be N number of unit cells 60 repeated and connected together (in series) in the tunable filter 20 for a total of N unit cells. For N unit cells, the inductors $L_1$ 40 are connected in series, with each inductor $L_1$ 40 shunted to ground by its respective capacitor 50. The interconnection of the ports 10, variable inductors $L_1$ 40, and capacitors C 50 is by transmission line 30. The transmission line 30 acts as a superconducting wire or waveguide to carry a microwave signal from port 1 via the tunable filter 20 to port 2, or vice versa. A coaxial cable can connect to the external ends of the ports 10 such that one coaxial cable inputs microwave signals and another coaxial cable outputs the microwave signals. The transmission line 30 can be a stripline, microstrip, etc. The variable inductors 40, capacitors 50, and transmission lines 30 are made of superconducting material. Examples of superconducting materials (at low temperatures, such as about 10-100 millikelvin (mK), or about 4 K) include niobium, aluminum, tantalum, etc.

Figure 2:
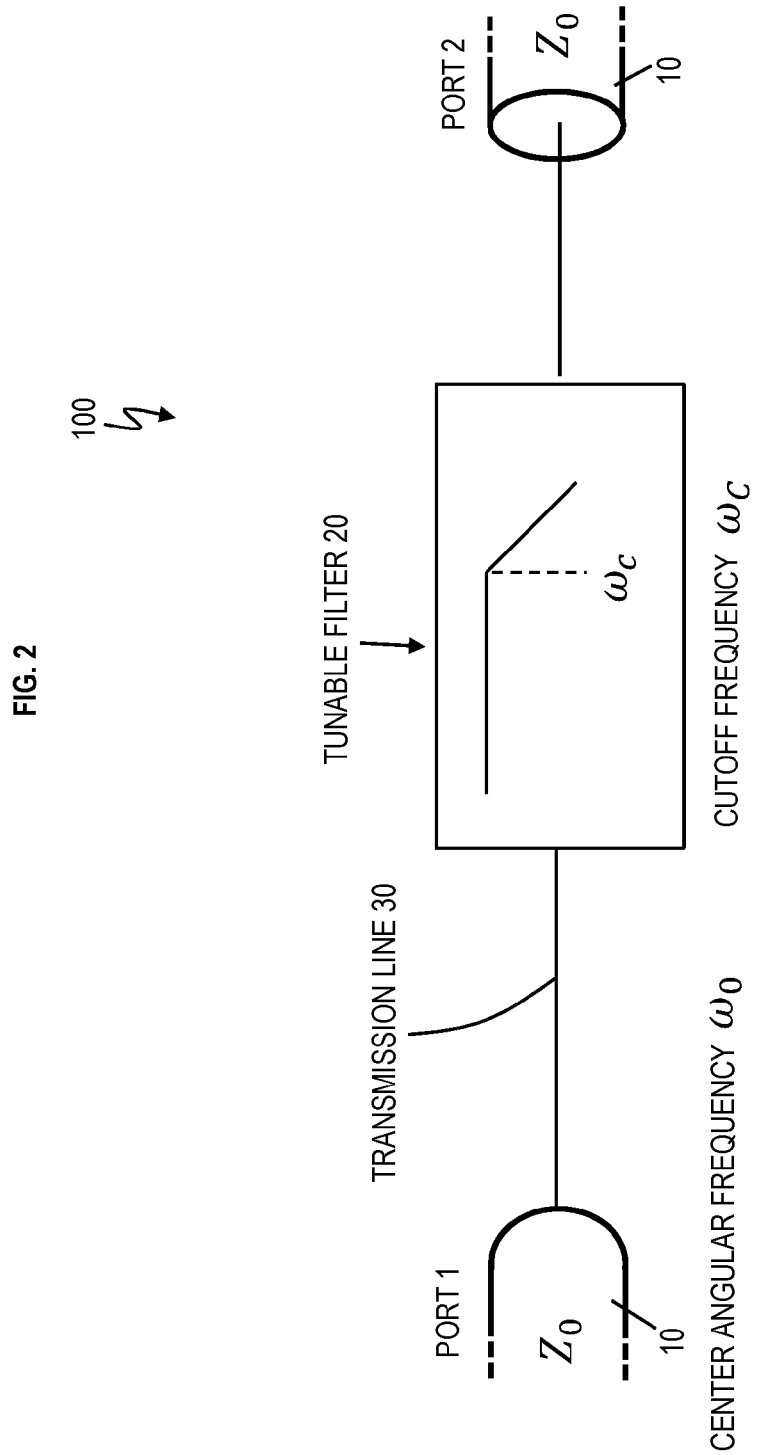
FIG. 2 is a block diagram of the superconducting microwave switch/router in FIG. 1 according to one or more embodiments.

FIG. 2 is a block diagram of the superconducting microwave switch/router 100 in FIG. 1 according to one or more embodiments. FIG. 2 is an equivalent circuit to FIG. 1 without depicting the internal details of the tunable filter 20.

It can be assumed that the microwave signal that is to be transmitted through the superconducting microwave switch/router 100 has a center angular frequency $\omega_0$. The impedance designation $Z_0$ is the characteristic impedance at ports 1 and 2 (which can be the input and output ports or vice versa). For example, the characteristic impedance $Z_0$ can be 50 ohms ($\Omega$) at each port.

For an individual unit cell 60, the impedance is $Z_1$ where $$Z_1 = \sqrt{\frac{L_1}{C}}$$

and where the angular frequency $\omega_1$ of the unit cell 60 is $$\omega_1 = \frac{1}{\sqrt{CL_1}}.$$

The cutoff angular frequency of the tunable filter 20 denoted as $\omega_C$ is on the order of the angular resonance frequency $\omega_1$ of the unit cell 60 (or multiple unit cells added together) and it is correlated with $\omega_1$, meaning $\omega_C$ increases and decreases with $\omega_1$. The exact dependence of $\omega_C$ on $\omega_1$ and on the number of unit cells N can be found through a microwave simulation or calculation. From this it follows that the cutoff frequency $\omega_C$ of the tunable filter 20 depends on the values of the variable inductor $L_1$ 40 and the capacitor C 50 (for the one or more unit cells 60). In particular, the inductance of the variable inductor $L_1$ 40 controls the cutoff frequency $\omega_C$ of the tunable filter 20, thereby controlling when the tunable filter 20 is operating in transmission or reflection with respect to the microwave signal (center angular frequency $\omega_0$). The inductance of the variable inductors $L_1$ 40 has an inverse relationship to the cutoff frequency $\omega_C$. For example, when the inductance of the variable inductor $L_1$ 40 is increased, the cutoff frequency $\omega_C$ of the tunable filter 20 is decreased. Conversely, when the inductance of the variable inductor $L_1$ 40 is decreased, the cutoff frequency $\omega_C$ of the tunable filter 20 is increased. It is noted that varying the inductance of the unit cells does not only change the cutoff frequency of the filter but also changes its characteristic impedance. Therefore, it can be desirable that $Z_1$ or the characteristic impedance of the filter matches the characteristic impedance of the ports as much as possible when the switch is closed, i.e., operated in the transmission mode.

Accordingly, when operating as a closed switch, the superconducting microwave switch/router 100 is controlled to pass the microwave signal (center angular frequency $\omega_0$) in transmission from port 1 to port 2 (or vice versa) by decreasing the inductance of the variable inductor $L_1$ 40 in the tunable filter 20. This allows the microwave signal (center angular frequency $\omega_0$) to fall within the low-pass band of the tunable filter 20. When operating as an open switch, the superconducting microwave switch/router 100 is controlled to block transmission of the microwave signal (center angular frequency $\omega_0$) from port 1 to port 2 (or vice versa) using reflection by increasing the inductance of the variable inductor $L_1$ 40 in the tunable filter 20. This allows the microwave signal (center angular frequency $\omega_0$) to fall outside of the low-pass band and thus be attenuated or in other words reflected.

Figure 3:
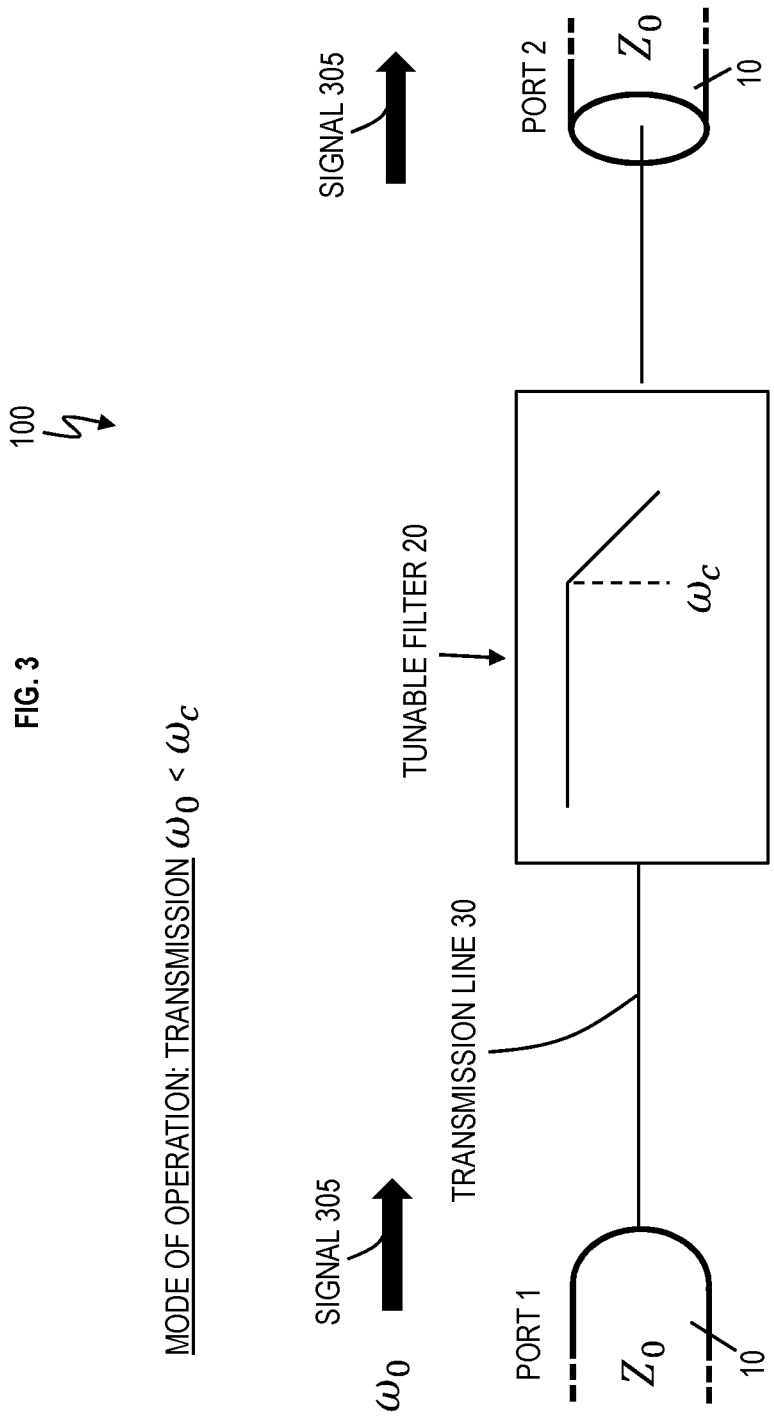
FIG. 3 is a schematic of the superconducting microwave switch/router illustrating transmission as the mode of operation according to one or more embodiments.

FIG. 3 is a schematic of the superconducting microwave switch/router 100 illustrating transmission as the mode of operation according to one or more embodiments. In FIG. 3, the tunable filter 20 is tuned such that the center angular frequency $\omega_0$ of the incoming microwave signal 305 through the device port is less than the cutoff frequency $\omega_C$ of the tunable filter 20, i.e., $\omega_0 < \omega_C$. In this mode of operation, the tunable filter 20 is configured to operate in transmission because the frequency of the microwave signal 305 is less than the cutoff frequency of the tunable low-pass filter 20. Under this condition, the microwave signal 305 is transmitted from port 1 through the tunable filter 20 to port 2, such that the microwave signal 305 is output as desired.

Figure 4:
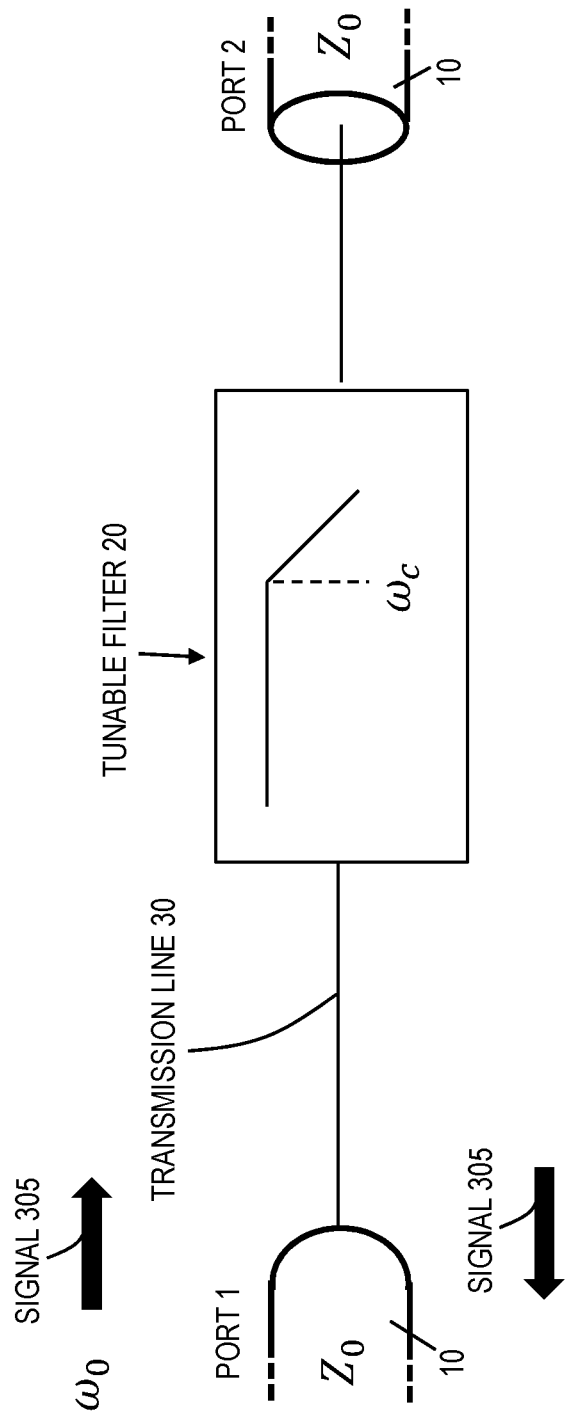
FIG. 4 is a schematic of the superconducting microwave switch/router illustrating reflection as the mode of operation according to one or more embodiments.

FIG. 4 is a schematic of the superconducting microwave switch/router 100 illustrating reflection as the mode of operation according to one or more embodiments. In FIG. 4, the tunable filter 20 is tuned such that the center angular frequency $\omega_0$ of the microwave signal 305 is greater than the cutoff frequency $\omega_C$ of the tunable filter 20, i.e., $\omega_0 > \omega_C$. In this mode of operation, the tunable filter 20 is configured to operate in reflection because the frequency of the microwave signal 305 is greater than the cutoff frequency of the tunable low-pass filter 20. Under this condition, when the microwave signal 305 enters through port 1, the microwave signal 305 is blocked from passing to port 2 because the tunable filter 20 reflects the microwave signal 305, thereby not allowing the microwave signal 305 to pass from port 1 to port 2.

Figure 5:
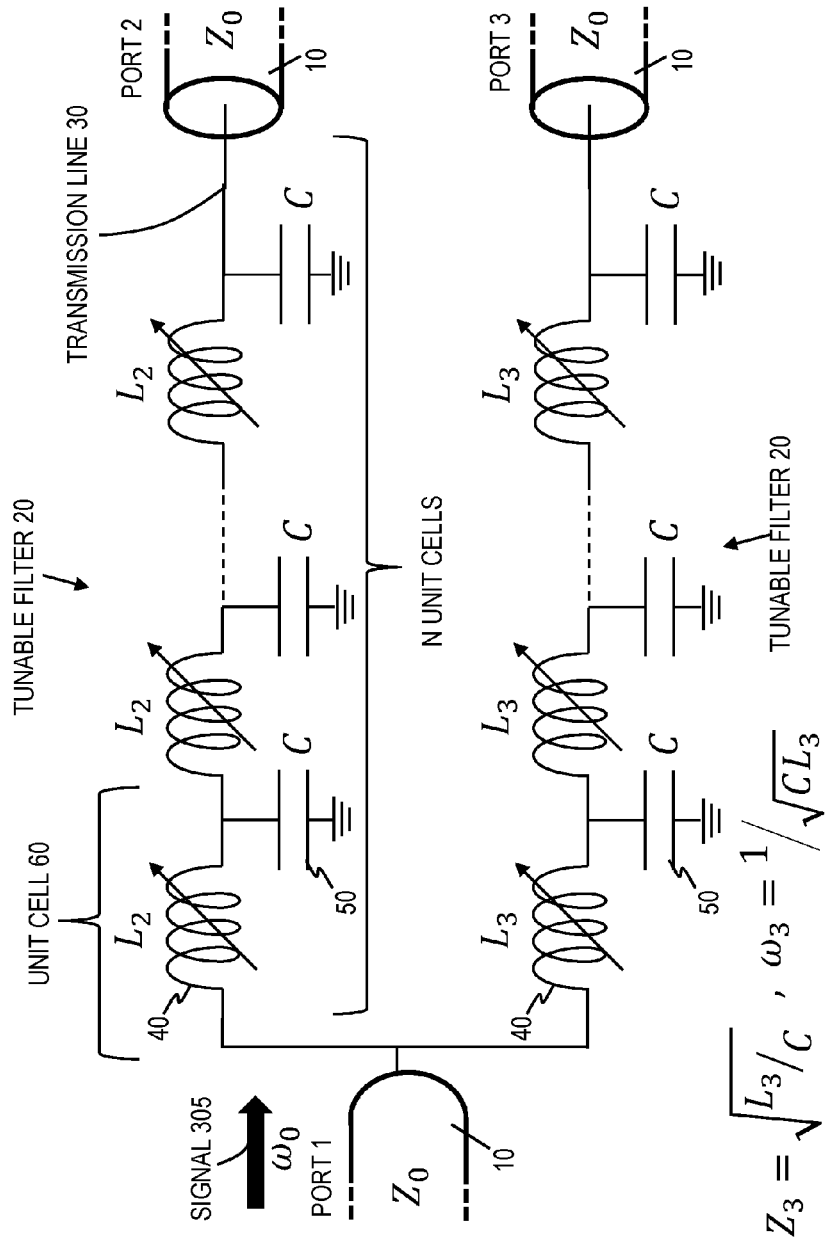
FIG. 5 is a schematic of a superconducting microwave switch/router according to one or more embodiments.
Figure 6:
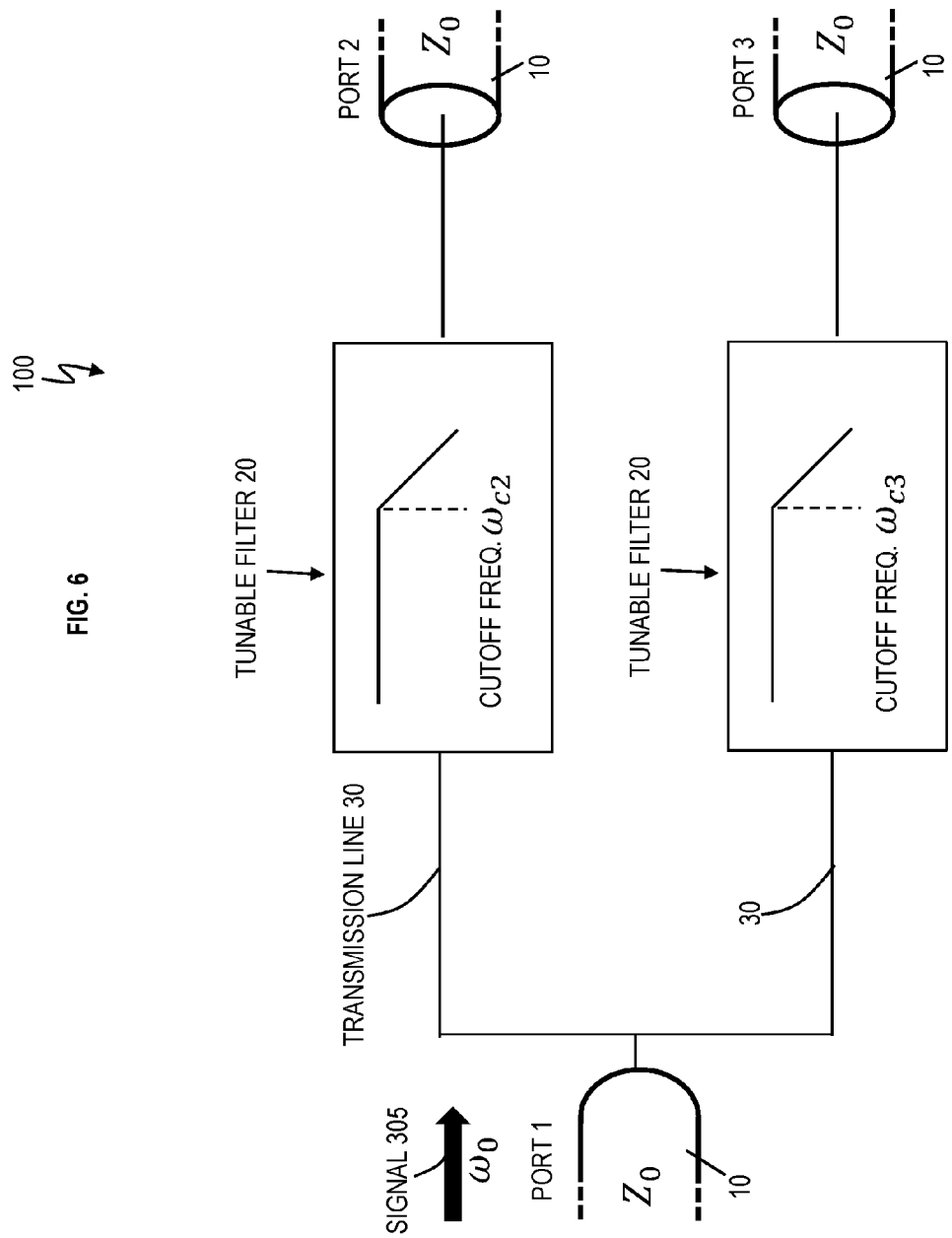
FIG. 6 is a block diagram of the superconducting microwave switch/router in FIG. 5 according to one or more embodiments.

FIG. 5 is a schematic of a superconducting microwave switch/router 100 according to one or more embodiments. FIG. 6 is a block diagram of the superconducting microwave switch/router 100 in FIG. 5 according to one or more embodiments. FIG. 6 is an equivalent circuit to FIG. 5 without depicting the internal details of the tunable filter 20. FIGS. 5 and 6 are analogous to FIGS. 1 and 2, except that FIGS. 5 and 6 have been extended to 3 ports instead of 2 ports. It is understood that the superconducting microwave switch/router 100 can be extended to N number of ports as desired according to embodiments.

In the configuration depicted in FIGS. 5 and 6, there are two tunable filters 20. One tunable filter 20 is connected between port 1 and port 2, while the other tunable filter 20 is connected between port 1 and port 3. Each of the tunable filters 20 is formed of one or more unit cells 60 as discussed above. For explanation purposes, the one or more variable inductors 40 are identified as $L_2$ in the tunable filter 20 connected between ports 1 and 2, while the one or more variable inductors 40 are identified as $L_3$ in the tunable filter 20 connected between ports 1 and 3. The tunable filters 20 between ports 1 and 2 and ports 1 and 3, respectively, are individually controlled such that one can be in transmission while the other is operating in reflection.

The tunable filter 20 between ports 1 and 2 includes one or more unit cells 60. Each unit cell 60 includes a variable inductor $L_2$ 40 and capacitor 50. In each unit cell 60, the variable inductor $L_2$ 40 is connected in series with ports 1 and 2, and the capacitor C 50 is connected to one end of the variable inductor 40 and to ground. There can be N number of unit cells 60 repeated and connected together in the tunable filter 20 for a total of N unit cells between ports 1 and 2. For the tunable filter 20 between ports 1 and 2, the impedance of each unit cell is $Z_2$ where $$Z_2 = \sqrt{\frac{L_2}{C}}$$

and the angular frequency is $\omega_2$ where $$\omega_2 = \frac{1}{\sqrt{CL_2}}.$$

Similarly, the tunable filter 20 connected between ports 1 and 3 includes one or more unit cells 60. Each unit cell 60 includes a variable inductor $L_3$ 40 and capacitor 50. In each unit cell 60, the variable inductor $L_3$ 40 is connected in series with ports 1 and 3, and the capacitor C 50 is connected to one end of the variable inductor $L_3$ 40 and to ground. There can be N number of unit cells 60 repeated and connected together in the tunable filter 20 for a total of N unit cells between ports 1 and 3. For the tunable filter 20 connected between ports 1 and 3, the impedance of each unit cell is $Z_3$ where $$Z_3 = \sqrt{\frac{L_3}{C}}$$

and the angular frequency is $\omega_3$ where $$\omega_3 = \frac{1}{\sqrt{CL_3}}.$$

It should be appreciated that additional ports and tunable filters can be analogously added as desired.

In FIG. 2, the cutoff frequency of the single tunable filter 20 was designated as $\omega_C$ above. Because more than one tunable filter 20 is provided in FIGS. 5 and 6, the tunable filter 20 connected between ports 1 and 2 is designated as cutoff frequency $\omega_{C2}$ while the tunable filter 20 connected between ports 1 and 3 is designated as cutoff frequency $\omega_{C3}$.

For operation of the microwave signal 305 in transmission from/between port 1 to port 2 (or vice versa), the tunable filter 20 between ports 1 and 2 is tuned such that the center angular frequency $\omega_0$ of the microwave signal 305 is less than the cutoff frequency $\omega_{C2}$ of the tunable filter 20 between ports 1 and 2, while the tunable filter 20 between ports 1 and 3 is tuned such that the center angular frequency $\omega_0$ of the microwave signal 305 is much greater than the cutoff frequency $\omega_{C3}$ between ports 1 and 3: $\omega_{C3} \ll \omega_0 < \omega_{C2}$. In this mode of operation, the tunable filter 20 between ports 1 and 2 is configured to operate in transmission because the microwave signal 305 ($\omega_0$) is less than the cutoff frequency $\omega_{C2}$, and therefore, the microwave signal 305 is transmitted from port 1 through the tunable filter 20 to port 2, such that the microwave signal 305 is output as desired. Concurrently, the tunable filter 20 connected between ports 1 and 3 is configured to operate in reflection because the microwave signal 305 ($\omega_0$) is greater than the cutoff frequency ($\omega_{C3}$), and therefore, the microwave signal 305 is blocked from passing between ports 1 and 3. Additional conditions for transmission from port 1 to port 2 (or vice versa) include $Z_2 \approx Z_0$ for impedance matching. Additional conditions for reflection from/between ports 1 and 3 include $Z_3 \gg Z_0$.

On the other hand, for operation of the microwave signal 305 in transmission from/between port 1 to port 3 (or vice versa), the tunable filter 20 between ports 1 and 3 is tuned such that the center angular frequency $\omega_0$ of the microwave signal 305 is less than the cutoff frequency $\omega_{C3}$ of the tunable filter 20 between ports 1 and 3, while the tunable filter 20 between ports 1 and 2 is tuned such that the center angular frequency $\omega_0$ of the microwave signal 305 is much greater than the cutoff frequency $\omega_{C2}$ between ports 1 and 2: $\omega_{C2} \ll \omega_0 < \omega_{C3}$. In this mode of operation, the tunable filter 20 between ports 1 and 3 is configured to operate in transmission because the microwave signal 305 ($\omega_0$) is less than the cutoff frequency $\omega_{C3}$, and therefore, the microwave signal 305 is transmitted from port 1 through the tunable filter 20 to port 3, such that the microwave signal 305 is output as desired. Concurrently, the tunable filter 20 connected between ports 1 and 2 is configured to operate in reflection because the microwave signal 305 ($\omega_0$) is greater than the cutoff frequency ($\omega_{C2}$), and therefore, the microwave signal 305 is blocked from passing between ports 1 and 2 in this example. Additional conditions for transmission from port 1 to port 3 (or vice versa) include $Z_3 \approx Z_0$ for impedance matching. Additional conditions for reflection from/between ports 1 and 2 include $Z_2 \gg Z_0$.

Figure 7:
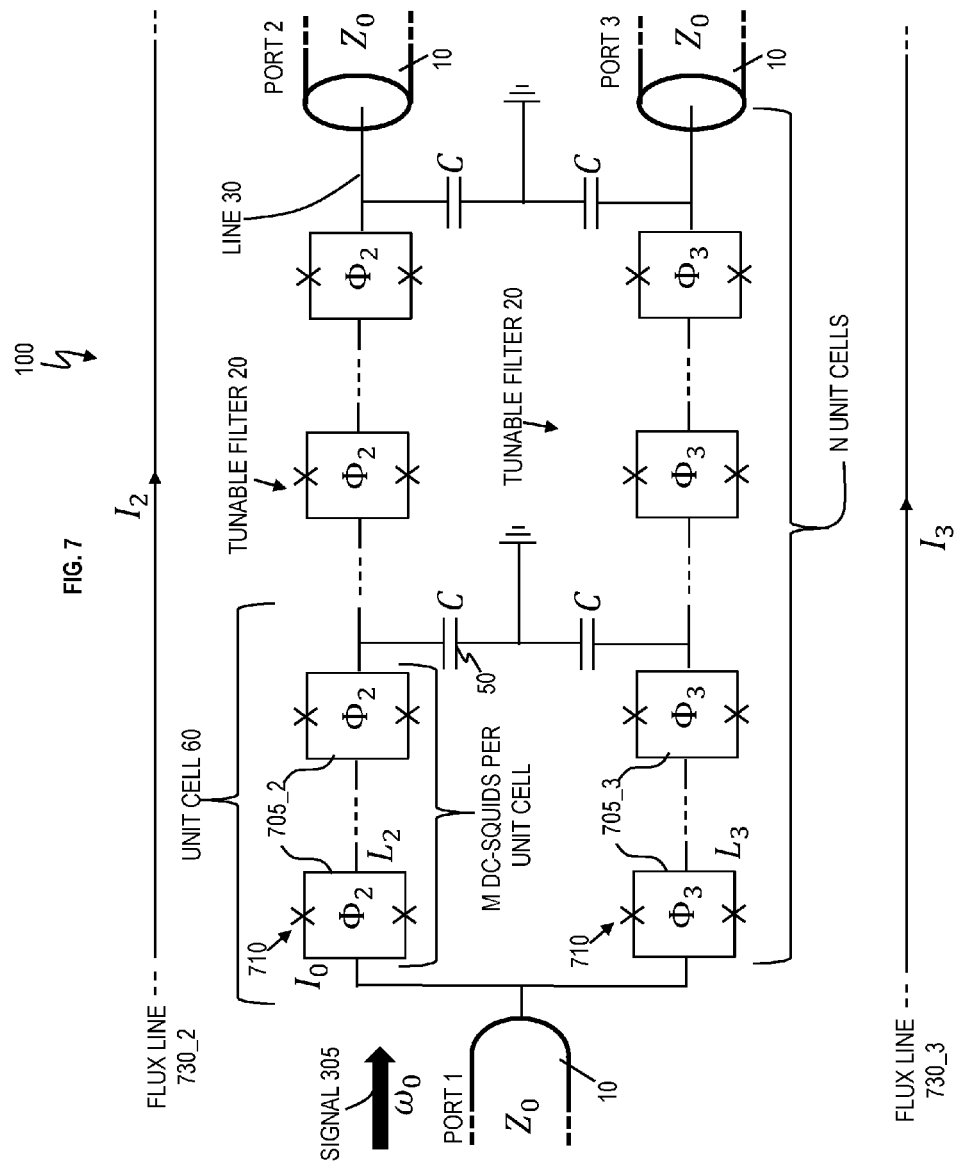
FIG. 7 is a schematic of a superconducting microwave switch/router according to one or more embodiments.

FIG. 7 is a schematic of a superconducting microwave switch/router 100 according to one or more embodiments. FIG. 7 is analogous to FIGS. 5 and 6, except that FIG. 7 implements the lossless/superconducting microwave switch/router 100 utilizing direct current (DC) superconducting quantum interference devices (SQUIDs). In FIG. 7, each of the variable inductors 40 (discussed above) is implemented as (variable) DC-SQUIDs 705 in the tunable filter 20. It is noted that the tunable filters 20 in FIG. 7 are configured to operate in transmission and reflection with respect to each of the tunable filters 20 as discussed above. Also, it is understood that the superconducting microwave switch/router 100 can be extended to N number of ports as desired according to embodiments.

In the configuration depicted in FIG. 7, there are two tunable filters 20 and three ports 10 depicted although more ports 10 and tunable filters 20 can be analogously added. One tunable filter 20 is connected between port 1 and port 2, while the other tunable filter 20 is connected between port 1 and port 3. Each of the tunable filters 20 is formed of one or more unit cells 60 as discussed herein.

For the tunable filter 20 connected between port 1 and port 2, each unit cell 60 includes one or more DC-SQUIDs 705_2. In the unit cell 60, the capacitor C 50 connects/shunts the one or more DC-SQUIDs 705_2 to ground. When more than one DC-SQUID 705_2 is utilized in the unit cell 60, the DC-SQUIDs 705_2 are connected together in series. There can be a total of M DC-SQUIDs 705_2 per unit cell, where M is an integer of 1 or more. The tunable filter 20 between ports 1 and 2 includes one or more unit cells 60, such that each unit cells 60 is connected in series with ports 1 and 2, and the capacitor C 50 is connected to one end of the DC-SQUID 705_2 and to ground. There can be N number of unit cells 60 repeated and connected together in series in the tunable filter 20 for a total of N unit cells between ports 1 and 2, where N is an integer of 1 or more. For the tunable filter 20 between ports 1 and 2, the impedance of each unit cell is $Z_2$ where $$Z_2 = \sqrt{\frac{L_2}{C}}$$

and the angular frequency is $\omega_2$ where $$\omega_2 = \frac{1}{\sqrt{CL_2}}.$$

It is noted that each DC-SQUID 705_2 has an inductance and/or is an inductive element designated $L_2$.

For the tunable filter 20 connected between port 1 and port 3, each unit cell 60 includes one or more DC-SQUIDs 705_3. In the unit cell 60, the capacitor C 50 connects/shunts the one or more DC-SQUIDs 705_3 to ground. When more than one DC-SQUID 705_3 is utilized in the unit cell 60, the DC-SQUIDs 705_3 are connected together in series.

There can be a total of M DC-SQUIDs 705_3 per unit cell, where M is an integer of 1 or more. The tunable filter 20 between ports 1 and 3 includes one or more unit cells 60, such that each unit cell 60 is connected in series with ports 1 and 3, and the capacitor C 50 is connected to one end of the DC-SQUID 705_3 and to ground. There can be N number of unit cells 60 repeated and connected together in the tunable filter 20 for a total of N unit cells between ports 1 and 3, where N is an integer of 1 or more. For the tunable filter 20 between ports 1 and 3, the impedance of each unit cell is $Z_3$ where $$Z_3 = \sqrt{\frac{L_3}{C}}$$

and the angular frequency is $\omega_3$ where $$\omega_3 = \frac{1}{\sqrt{CL_3}}.$$

It is noted that each DC-SQUID 705_3 has an inductance and/or is an inductive element designated $L_3$.

Now, further information regarding DC-SQUIDs is provided below. A SQUID (Superconducting Quantum Interference Device) is a type of superconducting electronic device well-known to those skilled in the art. In particular, the type of SQUID known as a DC-SQUID includes a loop formed of superconducting wire, superconducting thin-film metal or other superconducting material, interrupted by two or more Josephson junctions (JJ) 710. The SQUID contains two or more Josephson junctions 710 in a current-carrying loop. As is widely understood by those skilled in the art, via the principle of quantum interference of superconducting currents, the combined Josephson critical current of the Josephson junctions within the SQUID will vary depending on the magnetic flux threading the SQUID loop. Likewise, the Josephson inductance exhibited by the SQUID's Josephson junctions will also vary depending on such magnetic flux (which is magnetic flux $\Phi_2$ for each DC-SQUID 705_2 and magnetic flux $\Phi_3$ for each DC-SQUID 705_3). Furthermore, arrays of SQUIDs can be arranged in an electrical circuit in such a way as to combine their inductances. It is specified that the magnetic flux of an in-plane loop represents a well-known and well-defined quantity including the magnetic field within the loop, multiplied by the cosine of the angle that the field makes with the axis perpendicular to the loop, integrated across the entire area of the loop. Thus, the SQUID is highly sensitive to both the magnitude and the direction of the magnetic field in its vicinity (for example, flux line 730_2 creates the magnetic field to thereby cause magnetic flux $\Phi_2$ for each DC-SQUID 705_2, while flux line 730_3 creates the magnetic field to thereby cause magnetic flux $\Phi_3$ for each DC-SQUID 705_3). The DC-SQUID 705_2 and 705_3 respectively experience the magnetic flux $\Phi_2$, magnetic flux $\Phi_3$ from the respective magnetic fields created by flux line 730_2, flux line 730_3 and thereby its Josephson inductance (the Josephson inductance is designated $L_{J2}$ for DC-SQUID 705_2 and $L_{J3}$ for DC-SQUID 705_3) is changed. To one skilled in the art, this sensitivity to magnetic field enables the SQUID to be employed as a useful component in an electric circuit, in that the variation of the SQUID's Josephson inductance causes useful changes in the circuit's properties. The inductance $L_2$ and $L_3$ of the DC-SQUIDs 705_2 and 705_3, respectively, corresponds to the Josephson inductance $L_{J2}$ for DC-SQUID 705_2 and $L_{J3}$ for DC-SQUID 705_3. To independently change/control (increase or decrease) the inductance $L_2$ and $L_3$ of the DC-SQUIDs 705_2 and 705_3, flux lines 730_2 and 730_3 are provided. The flux lines are can be generally referred to as flux lines 730. The flux lines 730_2 and 730_3 independently apply a magnetic 'bias' field perpendicular to the SQUID loop of the respective DC-SQUIDs 705_2 and 705_3, in order to set the 'working point' of the SQUID. The flux line 730_2 has current $I_2$ that creates a magnetic field to cause the magnetic bias flux $\Phi_2$ to change as desired. Similarly, the flux line 730_3 has current $I_3$ that creates a magnetic field to cause the magnetic bias flux $\Phi_3$ to change as desired. Accordingly, the tunable filters 20 between ports 1 and 2 and ports 1 and 3, respectively, are individually controlled such that one can be in transmission while the other is operating in reflection.

The inductance $L_2$ (per unit cell 60) for the tunable filter 20 between ports 1 and 2 can be defined as $L_2 \simeq ML_{J2} + L_S$, where M is the number of DC-SQUIDS 705_2 in a unit cell, where $L_{J2}$ is the Josephson junction inductance of the DC-SQUID, and where $L_S$ is the series inductance of the transmission lines 30 (wires) of each unit cell. The inductance $L_2$ of each unit cell 60 is primarily based on the Josephson junction inductance $L_{J2}$. Therefore, Josephson junction inductance $L_{J2}$ is defined below (without the series inductance $L_S$ of the transmission line 30 (wires)): the Josephson junction inductance $$L_{J2} = \frac{L_{J0}}{\left|\cos\left(\pi\frac{\Phi_2}{\Phi_0}\right)\right|},$$

where $$L_{J0} = \frac{\Phi_0}{4\pi I_0},$$

where $I_0$ is the critical current of each Josephson junction 710, wherein $\Phi_2$ is the magnetic flux bias threading the loop, and where $$\Phi_0 = \frac{h}{2e}$$

(superconducting magnetic flux quantum) in which h is Planck's constant and e is the electron charge.

Similarly, the inductance $L_3$ (per unit cell 60) for the tunable filter 20 between ports 1 and 3 can be defined as $L_3 \simeq ML_{J3} + L_S$, where M is the number of DC-SQUIDS 705_3 in a unit cell, where $L_{J3}$ is the Josephson junction inductance, and where $L_S$ is the series inductance of the transmission line 30 (wires) of each unit cell. The inductance $L_3$ of each unit cell 60 is primarily based on the Josephson junction inductance $L_{J3}$. Therefore, Josephson junction inductance $L_{J3}$ is defined below (without the series inductance $L_S$ of the transmission line 30 (wires)): the Josephson junction inductance $$L_{J3} = \frac{L_{J0}}{\left|\cos\left(\pi\frac{\Phi_3}{\Phi_0}\right)\right|},$$

where $$L_{J0} = \frac{\Phi_0}{4\pi I_0},$$

where $I_0$ is the critical current of the (two) Josephson junctions 710, where $\Phi_3$ is the magnetic flux bias threading the loop, and where $$\Phi_0 = \frac{h}{2e}$$

(superconducting magnetic flux quantum) in which h is Planck's constant and e is the electron charge. In this analysis, the experimenters assume that the DC-SQUIDs have small loops and that the self-inductance of the DC-SQUID loop is negligible compared to the Josephson inductance of the DC-SQUID.

It is noted that the inductance $L_2$ is the inductance of one unit cell 60 out of N unit cells (N≥1) connected in series with the transmission line in the tunable filter 20 between ports 1 and 2, and likewise the inductance $L_3$ is the inductance of one unit cell 60 out of N unit cells (N≥1) connected in series with the transmission line in the tunable filter 20 between ports 1 and 3.

It should be understood by one skilled in the art that the tunable filter design discussed herein is not limited to identical unit cells with respect to the inductive and capacitive elements in each unit cell. The identical unit cell picture is mainly presented here for simplicity and ease of understanding. In fact, varying the unit cells based on the microwave filter theory can be advantageous and yield a better performance in terms of the maximum amplitude of ripples in the filter response, the filter flatness, the filter bandwidth, the amount of reflection in-band and out-of-band, the amount of attenuation in the stopping band, etc. Accordingly, it should be appreciated that the unit cells may or may not be identical in one or more embodiments to employ any or more of the advantages discussed above.

As should be recognized, the superconducting microwave switch/router 100 can have one input port and N output ports in one configuration, and/or have one output port and N input ports in another configuration. All ports 10 of the device have the same characteristic impedance $Z_0$. Each input-output pair is connected through a tunable low-pass filter whose cut-off frequency can be tuned in-situ using applied magnetic flux. The tunable low-pass filter 20 can be implemented using a ladder of inductive elements (DC-SQUIDs) and capacitive elements (lumped-element capacitors).

By controlling the DC currents $I_2$ and $I_3$ respectively applied to the flux lines 730_2 and 730_3, one can independently set the magnetic bias fluxes $\Phi_2$ and $\Phi_3$ which determine inductance $L_2$ and $L_3$ in each chain. This in turn tunes the cutoff angular frequencies $\omega_{C2}$, $\omega_{C3}$ of the two tunable filters 20 relative to $\omega_0$ (of the microwave signal 305), such that one path (between ports 1 and 2) is in transmission while the other path (between ports 1 and 3) is in reflection, or vice versa.

To operate in reflection (i.e., block the microwave signal 305) for either tunable filter 20 (between ports 1 and 2 or between ports 3 and 4), one increases the DC currents $I_2$, $I_3$ to increase the magnetic bias flux $\Phi_2$, $\Phi_3$ (within 1 period of the cosine), which then increases the inductance $L_2$, $L_3$, thereby decreasing the cutoff angular frequency $\omega_{C2}$, $\omega_{C3}$. Conversely, to operate in transmission (i.e., pass the microwave signal 305) for either tunable filter 20 (between ports 1 and 2 or between ports 3 and 4), one decreases the DC currents $I_2$, $I_3$ to decrease the magnetic bias flux $\Phi_2$, $\Phi_3$ (within 1 period of the cosine), which then decreases the inductance $L_2$, $L_3$, thereby increasing the cutoff angular frequency $\omega_{C2}$, $\omega_{C3}$.

The DC-SQUIDs 705, capacitors 50 (with the exception of the dielectric material in the capacitors), flux lines 730, transmission lines 30, and Josephson junctions 710 are made of superconducting material. Again, examples of superconducting materials (at low temperatures, such as about 10-100 millikelvin (mK), or about 4 K) include niobium, aluminum, tantalum, etc. A Josephson junction is a nonlinear element formed of two superconducting metals sandwiching a thin insulator such as, for example, aluminum oxide, niobium oxide, etc.

Figure 8:
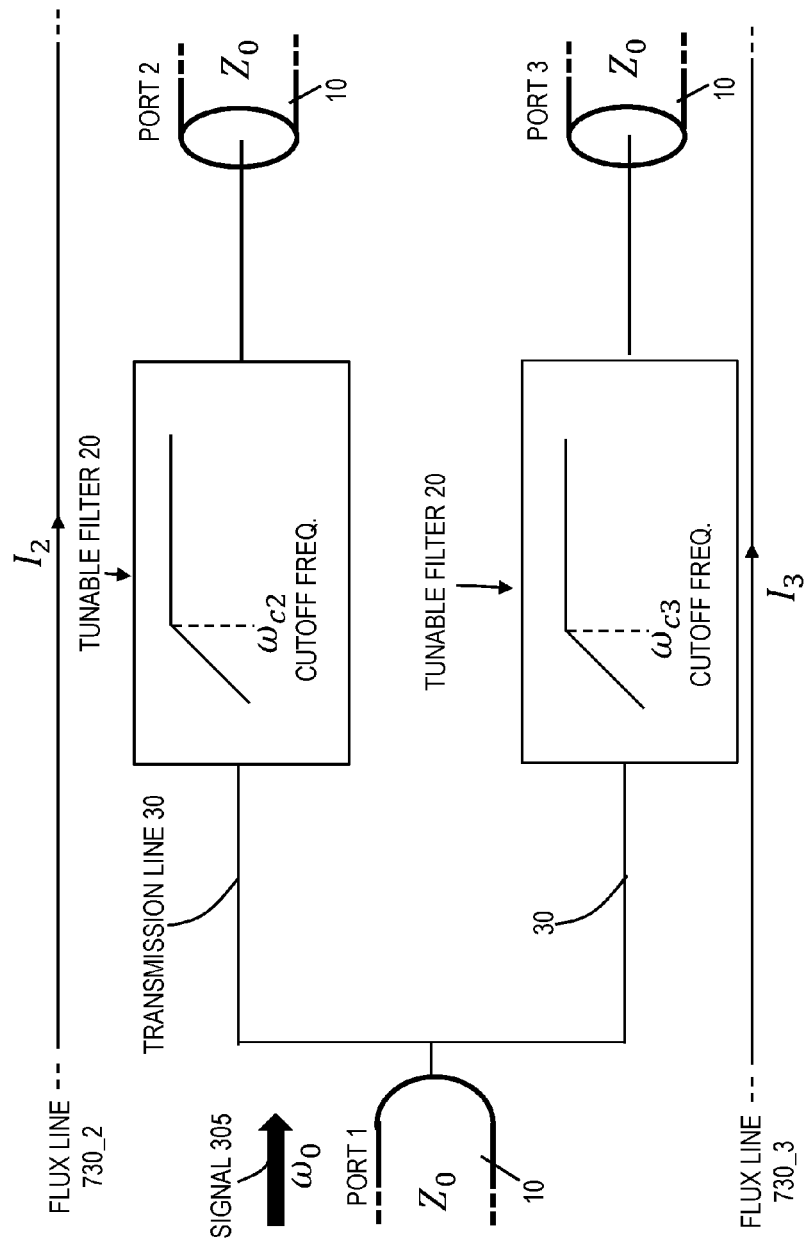
FIG. 8 is a schematic of a superconducting microwave switch/router according to one or more embodiments.

FIG. 8 is a schematic of a superconducting microwave switch/router 100 according to one or more embodiments. FIG. 8 is analogous to FIGS. 1-7, except for in this implementation, the tunable filters 20 are tunable high-pass filters. By having high-pass filters as the tunable filters 20, the inductive elements 40, 705 are interchanged with the capacitive elements 50. Accordingly, the capacitive elements 50 are in series between port 1 and 2 and between port 1 and 3, while the inductive elements 40, 705 (inductor or DC-SQUID) connects to one end of the capacitive element 50 and then connects to ground. For transmission from port 1 to port 2 (or vice versa), the following condition applies: $\omega_{c2} < \omega_0 \ll \omega_{c3}$. For transmission from port 1 to port 3 (vice versa), the following condition applies $\omega_{c3} < \omega_0 \ll \omega_{c2}$.

Figure 9:
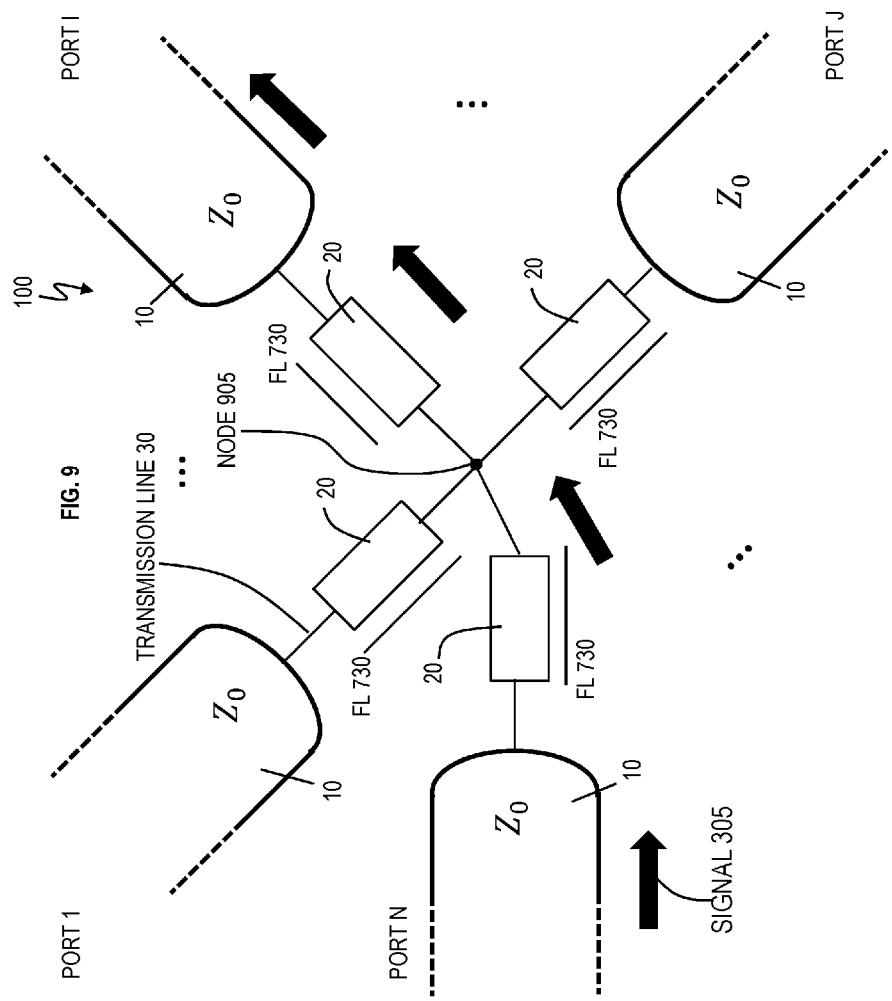
FIG. 9 is a schematic of an N port superconducting microwave switch/router according to one or more embodiments.

Now turning to FIG. 9, FIG. 9 is a schematic an N-port superconducting microwave router 100 according to one or more embodiments. The N-port superconducting microwave router 100 is generalized/designed such that there can be a connection made between any pair of ports 10 on the fly using current pulses to the relevant flux lines which in turn flux bias the relevant filters to their appropriate flux bias points. For example, at the moment (or nearly at the moment) the microwave signal 305 reaches a port 10, the connection can be made between any pair of ports 10 to transmit the microwave signal 305 while all other ports 10 (via their respective tunable filter 20) block the microwave signal 305. Accordingly, the microwave signal 305 can be routed between any pair of ports 10 according to the principles discussed herein.

The N-port superconducting microwave router 100 includes port 1, port I, port J, through port N. Each of the port 1-N has its own tunable low-pass filter 20, such that an individual port 10 connects to a tunable filter 20 that connects to a node 905. The features extensively described above in FIGS. 1-8 apply to FIG. 9 and are not repeated for the sake of brevity and to avoid obscuring FIG. 9. All of the ports 1-N are symmetrical and are on the same footing (which is different from the previously described superconducting microwave switches/router 100 above). Being on the same footing means that the node 905 is a central connection that connects all of the ports 1-N, that each port 10 has its own tunable filter 20, and that each tunable filter 20 has its own flux line (FL) for tuning its cutoff frequency.

As one example, to route the microwave signal 305 from port N to port I, both tunable filters 20 between port N and node 905 and between port I and node 905 have to be tuned to be in transmission; concurrently, all remaining tunable filters 20 are tuned to be in reflection. This allows the microwave signal 305 to be transmitted from port N to its tunable filter 20, to the node 905, to tunable filter 20 connected to port I, and then transmitted to port I.

Regarding the node 905, a few technical details are discussed. In general, node 905 is to be as small as possible and ideally lumped with respect to the wavelengths used in the device operation for two reasons: 1) minimize reflections, which can limit the transmission of the routed signal, and 2) enable connecting multiple transmission lines to the node 905. Furthermore, the ability to connect multiple transmission lines to a common node 905 can require using high impedance (very narrow) wires, which might in turn require designing the tunable filters to have a characteristic impedance which matches the impedance of the connecting lines when the filters are operating in transmission (in order to minimize reflections) in one implementation. Lastly, if the characteristic impedance of the tunable filters is different from the characteristic impedance of the device ports, certain matching networks can be designed and integrated between the filters and the device (in order to allow smooth transmission for the propagating signals).

A method of configuring a lossless/superconducting microwave switch/router 100 is provided according to one or more embodiments. Reference can be made to FIGS. 1-9 discussed herein. A plurality of ports 10 is provided. Tunable filters 20 are provided and connected to the ports 10, such that each of the plurality of ports 10 has a corresponding one of the tunable filters 20. The tunable filters 20 connect to a node 905 (a conductive connection point). A plurality of flux lines (FL) 730 are provided, such that an individual one of the plurality of flux lines 730 tunes an individual one of the tunable filters 20 on a one-to-one basis. A plurality of magnetic sources (such as flux lines, current carrying wires, tunable magnets, etc.) are provided, such that an individual one of the plurality of magnetic sources tunes an individual one of the tunable filters 20 on a one-to-one basis. It should be noted that this picture of one flux line controlling one tunable filter can be simplistic. This is because the DC-SQUID's response/inductance is determined by the total flux threading its loop, and therefore any change in the current of other flux lines can alter, in principle, the flux bias experienced by the DC-SQUID. Of course, the induced flux by the other flux lines drops considerably with the distance between them and the DC-SQUID, thus by keeping them sufficiently apart the experimenters can significantly reduce their contribution. Nevertheless, there can be one or more scenarios that in order to tune the flux bias of one filter, one might apply multiple changes to the currents flowing in nearby flux lines such that the currents yield the desired flux bias in the various controlled filters.

A method for configuring a lossless/superconducting microwave switch/router 100 is provided according to one or more embodiments. Reference can be made to FIGS. 1-9 discussed herein. A plurality of ports 10 is provided. Tunable filters 20 are connected to the plurality of ports 10, where each of the plurality of ports 10 is associated with one of the tunable filters 20, where each of the tunable filters 20 includes a superconducting quantum interference device 705. The tunable filters 20 can be low-pass filters. The tunable filters 20 can be high-pass filters.

A method of configuring a lossless/superconducting microwave switch/router 100 is provided according to one or more embodiments. Reference can be made to FIGS. 1-9 discussed herein. A node 905 is provided as a central connection point. Tunable filters 20 are connected to the node 905, where the tunable filters 20 are configured to be independently tuned to a first state (i.e., mode of operation for transmission) to transmit a microwave signal 305 and be independently tuned to a second state (i.e., mode of operation for reflection) to block the microwave signal 305, such that any one of the tunable filters 20 is configured to transmit the signal to any other one of the tunable filters 20 via the node 905.

A method of configuring a lossless/superconducting microwave switch/router 100 is provided according to one or more embodiments. Reference can be made to FIGS. 1-9 discussed herein. A plurality of ports 10 is provided. A first pair of the plurality of ports 10 has at least one tunable filter 20 connected in between, in which the tunable filter 20 is configured to transmit a microwave signal 305. A second pair of the plurality of ports 10 has another tunable filter 20 connected in between, in which the another tunable filter 20 is configured to reflect the microwave signal.

Technical effects and benefits include a lossless/superconducting microwave switch/router. Technical benefits further include low attenuation of transmitted signals<0.05 dB (decibels), fast switching (no resonators) such as in nanoseconds (depending on the mutual inductance between the flux lines and the SQUIDs), and relatively large bandwidth (bw)>280 megahertz (MHz) (which can be significantly enhanced by allowing certain variation in the unit cells). Also, technical benefits further include relatively large on/off ratio>20 dB. The lossless/superconducting microwave switch/router can tolerate relatively large powers>−80 dBm (where 0 dBm corresponds to 1 milliwatt) by adding more SQUIDs and increasing their critical current. The lossless/superconducting microwave switch/router can be fabricated with Nb Josephson junctions to operate at 4K, can be designed for any frequency range, and provides a scalable scheme that can be easily extended to 1 input-N outputs (or vice versa).

Now turning to microwave signal combiners and microwave signal distributors, employing microwave signal combiners in order to combine quantum signals in the microwave domain comes at the expense of impedance mismatches between the ports (which causes reflections), poor isolation between (certain) ports, and/or loss of quantum information due to attenuation of the quantum signal. The loss of quantum information can be either due to internal loss of the power combiner or leakage to other ports. This loss of quantum information can result in a significant decrease in the signal-to-noise ratio of the measurement.

Furthermore, in a scalable quantum processor architecture based on superconducting qubits, it is important to minimize the number of input and output lines that go into a dilution fridge. One way to achieve this on the output side is, for example, by combining multiple readout signals of multiple qubits on the same output line using hybrids or commercial power combiners. Subsequently, a broadband quantum-limited amplifier can be utilized to amplify the multiple readout signals before they propagate up the output chain. However, using such hybrids or power combiners attenuate the quantum signals before the amplifier and result in significant loss of quantum information, thus limiting the efficiency of the quantum measurement.

Another possibility is to add the power combiners following multiple quantum-limited amplifiers which amplify each individual signal. However, the downside of this scheme is the addition of bulky hardware (multiple amplifiers) to the dilution fridge which limits scalability of such as scheme. A dilution refrigerator is a cryogenic device that provides continuous cooling to temperatures as low as 7 mK, with no moving parts in the low-temperature region.

Below are a few examples of power combiners or dividers.

The following are characteristics of a T-Junction power combiner: 1) 3-port device with one input port and two output ports, 2) lossless, 3) reciprocal, 4) no isolation between the output ports, and 5) matched only to the input.

Characteristics of a resistive divider include the following: 1) 3-port device, 2) reciprocal, 3) can be matched at all ports (no reflection), 4) lossy, and 5) no isolation between the output ports.

Characteristics of hybrids (90° and 180° hybrids) include the following: 1) 4-port devices with two input ports and two output ports, 2) reciprocal, 3) can be matched at all ports (no reflection), 4) good isolation between the two input ports, and between the two output ports. If the hybrids are used as a power combiner, the power is divided equally between the two output ports such that half of the information is lost.

The following are characteristics of a Wilkinson power divider/combiner: 1) 3-port device with one input and two output ports (can be generalized to N-way device), 2) matched at all ports (no reflection), 3) isolation between the two output ports, 4) lossy when combining signals that are input on the output ports, because only half of the signal power shows up at the input, while the other half is dissipated.

One or more embodiments address problems or issues related to multiplexing the drive and readout of multiple qubit-resonator systems using a small number of input and output lines (thereby providing scalability), without causing loss of quantum information (lossless), and without allowing leakage of signals between different qubit-resonator systems (isolation between input ports and/or isolation between output ports). Embodiments include one or more methods and devices that separate the microwave signals (drive signals and readout signals) based on their frequency, thus allowing the methods and devices to multiplex the readout and drive of multiple qubits without attenuating the microwave signals used in the drive/readout. Also, the devices are provided with isolation between the different ports.

According to one or more embodiments, the device can be a multiport on-chip superconducting microwave combiner and/or distributer for quantum signals. The microwave combiner and distributer are lossless and their ports are matched to the input/output environment. The superconducting microwave combiner and/or distributer can be used in scalable quantum processing architectures, such as for qubit drive and readout.

In one or more embodiments, a microwave combiner and distributer are configured in the same device. The direction of the input signals determines if the device is operating as a microwave combiner or distributer.

Figure 10:
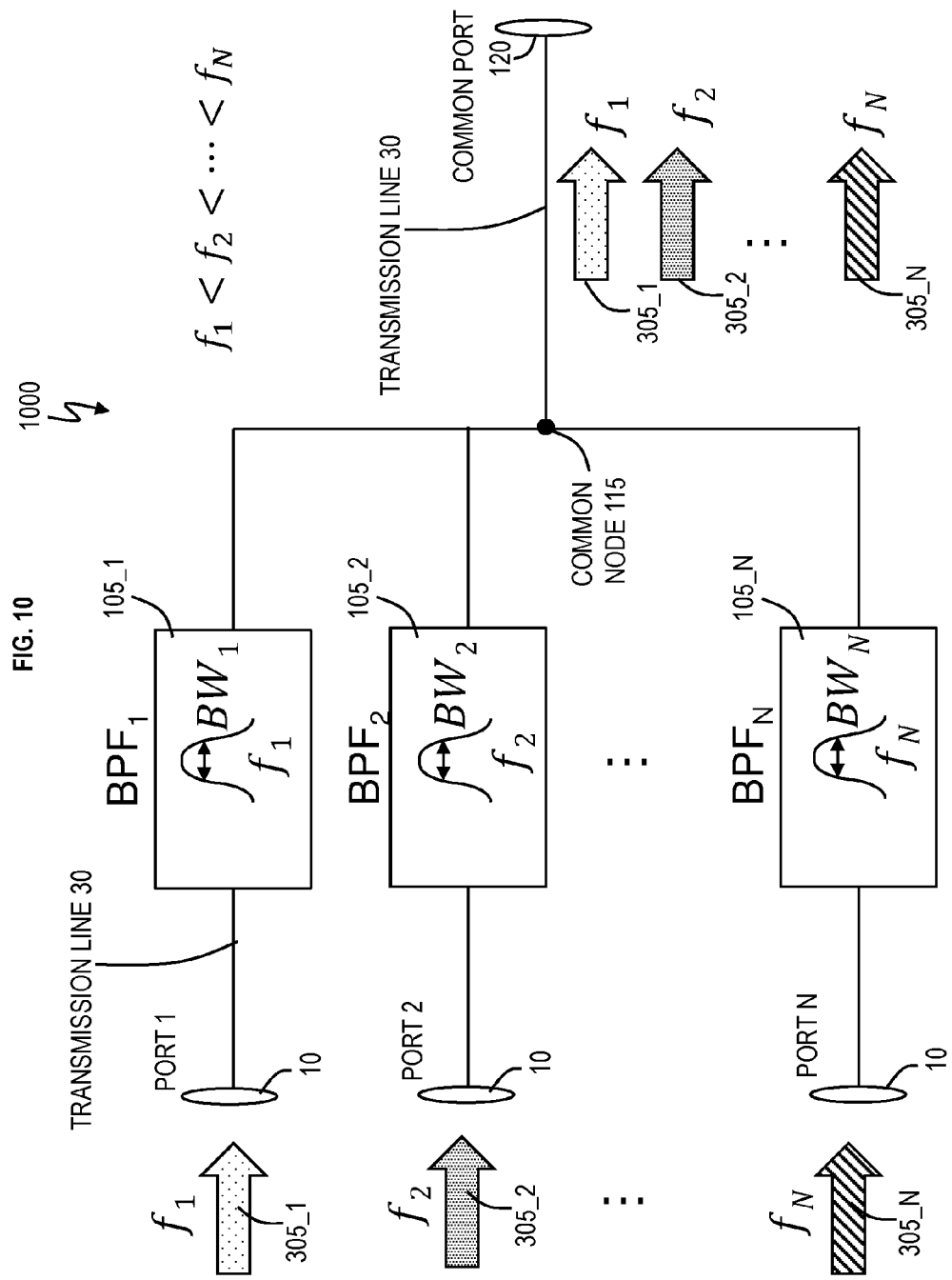
FIG. 10 is a schematic of a device depicting a microwave combiner for quantum signals according to one or more embodiments.

FIG. 10 is a schematic of a device depicting a microwave combiner for quantum signals according to one or more embodiments. The device 1000 is configured to utilize frequency-division multiplexing to allocate different frequencies for different microwave signals onto a single output transmission line.

The device 1000 includes bandpass microwave filters generally referred to as bandpass filters 105. The different bandpass filters 105 are depicted as bandpass filters 105_1 through bandpass filters 105_N. Each bandpass filter 105 has a different narrow passband through which microwave signals having a frequency in the particular narrow passband are transmitted (i.e., passed) and signals having a frequency outside of the particular narrow passband are reflected (i.e., blocked). The bandpass filter 105_1 has its own narrow passband with a bandwidth 1 ($B\omega_1$), bandpass filter 105_2 has its own narrow passband with a bandwidth 2 ($B\omega_2$), and bandpass filter 105_N has its own narrow passband with a bandwidth N ($B\omega_N$).

For example, bandpass filter 105_1 is configured with a passband (frequency band) that permits a microwave signal 305_1 having frequency $f_1$ to pass (transmit) through but blocks (reflects) all other microwave signals 305_2 through 305_N having frequencies $f_2$ through $f_N$ which are outside of the passband for bandpass filter 105_1. Similarly, bandpass filter 105_2 is configured with a passband (frequency band) that permits a microwave signal 305_2 having frequency $f_2$ to pass (transmit) through but blocks (reflects) all other microwave signals 305_1, 305_3 through 305_N having frequencies $f_1$, $f_3$ through $f_N$ which are outside of the passband for bandpass filter 105_2. Analogously, bandpass filter 105_N is configured with a passband (frequency band) that permits a microwave signal 305_N having frequency $f_N$ to pass (transmit) through but blocks (reflects) all other microwave signals 305_1 through 305_N-1 having frequencies $f_1$ through $f_{N-1}$ which are outside of the passband for bandpass filter 105_N. The microwave signals 305_1 through 305_N are generally referred to as microwave signals 305. When cavity-qubit quantum systems are operatively connected to the device 1000, the microwave signals 305 can be at respective frequencies $f_1$ through $f_N$ designated to drive particular qubits or designated to readout qubit (via readout resonators or cavities), as understood by one skilled in the art.

As an example, one bandpass filter 105 can have a passband of 1 megahertz (MHz), another bandpass filter 105 can have a passband of 10 MHz, yet another bandpass filter 105 can have a passband of 100 MHz, and so forth.

The device 1000 includes ports 10 individually connected to respective bandpass filters 105. Particularly, the different ports 10 are designated as port 1, port 2 through port N, where port N represents the last of the ports 10. Similarly, N represents the last of the frequencies, microwave signals 305, bandpass filters 105, quantum systems 3050 (discussed in FIG. 12 below), and so forth. In the device 1000, port 1 is connected to bandpass filter 105_1, port 2 is connected to bandpass filter 105_2, and port N is connected to bandpass filter 105_N. Each port_1 through port_N is connected to one end of its own bandpass filter 105_1 through bandpass filter 105_N. The other end of the bandpass filter 105_1 through bandpass filter 105_N is connected to a common port 120 via a common node 115. The common node 115 can be a common connection point, a common transmission line, a common wire, etc., as a mutual location for electrical connection. The common port 120 connects to each bandpass filter 105_1 through bandpass filter 105_N, while the individual ports 10 (ports 1-N) are connected (only) to their respective bandpass filter 105_1 through bandpass filter 105_N.

Because the bandpass filters 105_1 through 105_N only transmit respective microwave signals 305_1 through 305_N in the respective passband, the device 1000 is configured such that each bandpass filter 105_1 through bandpass filter 105_N covers a different band (or sub-band) of frequencies, such that none of the passbands (of the bandpass filters 105) are overlapping. Accordingly, each port 1, port 2, through port N is isolated from one another because of being connected to its respective bandpass filter 105_1 through 105_N, such that no microwave signal 305 through any one port 10 (whether entering or exiting) leaks into another port 10 via the common node 115. As such each port 10 is isolated from other ports 10 and is designed to transmit its own microwave signal 305 at a predefined frequency (or within a predefined frequency band), as a result of being connected to its own bandpass filter 105. As such, the bandpass filters 105_1 through 105_N are responsible for providing the isolation among ports 10 (e.g., port 1, port 2 through port N).

The respective ports 10, bandpass filters 105, common node 115, and common port 120 are connected to one another via transmission lines 30. The transmission line 30 can be a stripline, microstrip, etc. The microwave bandpass filters 105 are designed and implemented using lossless or low loss lumped elements such as superconducting inductors, superconducting gap capacitors and/or plate capacitors, passive superconducting elements. The superconducting elements include lumped-element inductors, gap capacitors, and/or plate capacitors (with low loss dielectrics). Other possible implementations of the bandpass filters include coupled-line filters, and/or capacitively-coupled series resonators.

The respective ports 10, bandpass filters 105, common node 115, common port 120, and transmission lines 30 are made of superconducting materials. Examples of superconducting materials (at low temperatures, such as about 10-100 mK, or about 4 K) include niobium, aluminum, tantalum, etc.

In one implementation of the device 1000 as a microwave combiner, a coaxial cable can connect to the external ends of the ports 10 and 120 such that coaxial cables connected to ports 10 input microwave signals 305_1 through 305_N at different frequencies $f_1$ through $f_N$ while another coaxial cable connected to common port 120 outputs the combined microwave signals 305_1 through 305_N. In the microwave combiner, for each microwave signal 305_1 through 305_N at its respective frequency $f_1$ through $f_N$, none of the microwave signals 305 are transmitted back through any of the other (input) ports 10 (i.e., port isolation), but instead each microwave signal 305_1 through 305_N passes through its respective bandpass filter 105_1 through 105_N, passes through the common node 115, and exits through the common port 120. As such, the microwave combiner combines the microwave signals 305_1 through 305_N and outputs them through the common port 120. The device 1000 is configured with the frequency relation $f_1<f_2<\ldots<f_N$, where each frequency $f_1, f_2, \ldots f_N$ is the center frequency of the bandpass filters 105_1 through 105_N, respectively. The device 1000 is configured such that it satisfies the inequality $$\frac{BW_j + BW_i}{2} < |f_j - f_i|$$

where $i, j=1, 2, \ldots N$ and $j \neq i$. This inequality requires that the frequency spacing between the center frequencies of each pair of bandpass filters exceeds their average bandwidths. In other words, the inequality ensures that none of the bandpass filters have overlapping bandwidths (i.e., frequency range).

Each port 1 through port N with its respective transmission line 30 (and respective bandpass filter 105_1 through 105_N) is considered a different/separate channel/input, and common port 120 is a common channel. Accordingly, when operating as a power combiner, multiple input channels of ports 1 through N are connected to the (single) common channel of common port 120. The device 1000 is configured to be bidirectional. As noted herein, the same device 1000 can be utilized as a both a microwave power combiner and microwave signal distributer.

Figure 11:
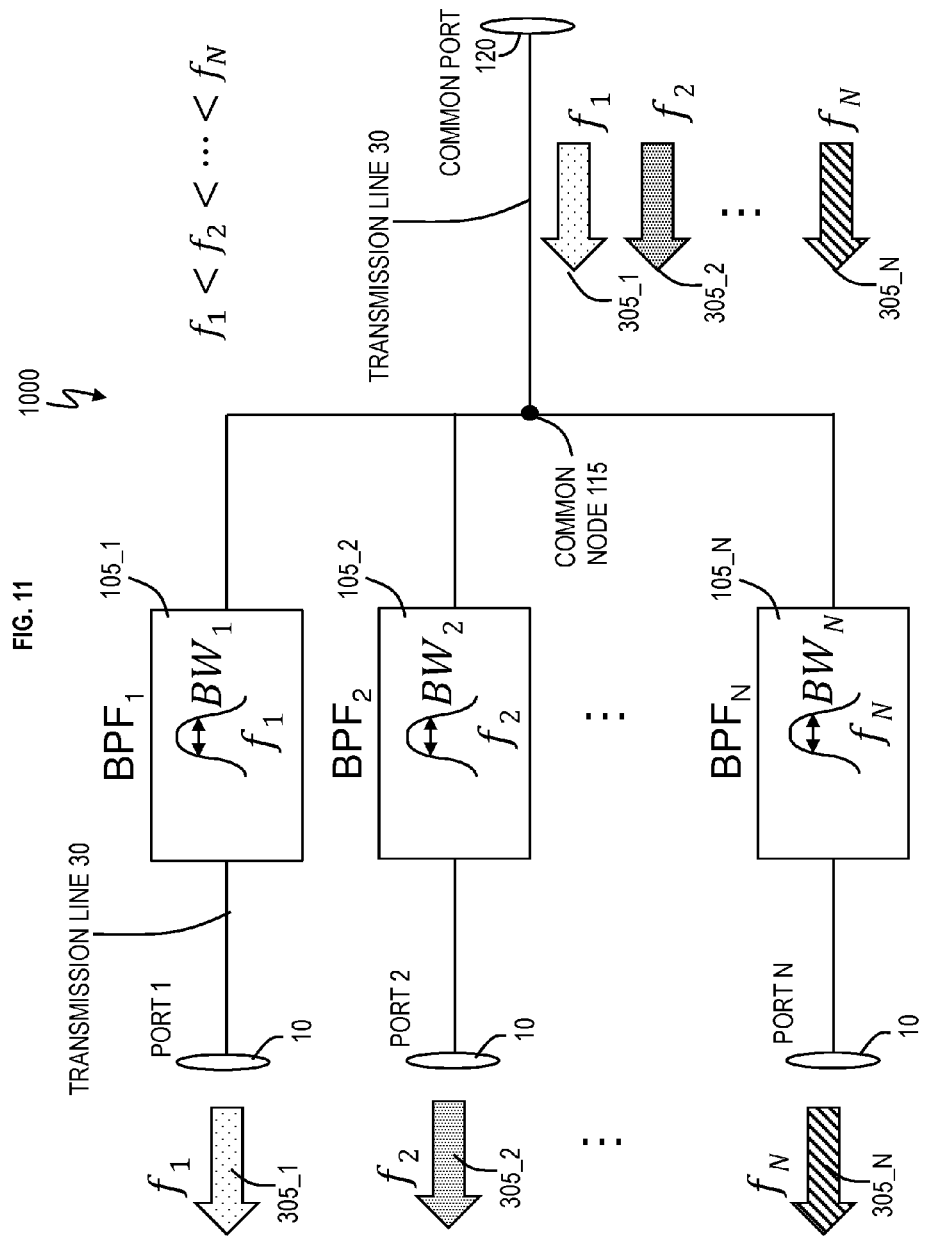
FIG. 11 is a schematic of the device depicting a microwave distributer for quantum signals according to one or more embodiments.

FIG. 11 is a schematic of the device 1000 depicting a microwave distributer for quantum signals according to one or more embodiments. The microwave distributer device 1000 is configured to distribute the microwave signals 305_1 through 305_N input on the common port 120 to individual ports 1 through N, in which the microwave signals 305_1 through 305_N are directed/distributed according to the passband of the respective bandpass filter 105_1 through 105_N.

In one implementation of the device 1000 as the microwave distributer, a coaxial cable can connect to the external ends of the common port 120 such that the coaxial cable connected to the common port 120 inputs the microwave signals 305_1 through 305_N at different frequencies $f_1$ through $f_N$ while other coaxial cables connected to output ports 10 output the individual microwave signals 305_1 through 305305N. In the microwave distributer, for each microwave signal 305_1 through 305_N at its respective frequency $f_1$ through $f_N$, only individual frequencies $f_1$ through $f_N$ are permitted to pass through the respective bandpass filters 105_1 through 105_N having a passband covering the corresponding frequency $f_1$ through $f_N$, thus passing through individual port 1 through port N. Because each of the bandpass filters 105_1 through 105_N has no overlapping passband, each microwave signal 305_1 through 305_N has its own frequency $f_1$ through $f_N$ predefined to only pass through one of the bandpass filters 105_1 through 105_N. The microwave signals 305 at its own one of the frequencies $f_1$ through $f_N$ are input through the common port 120, and each microwave signal 305_1 through 305_N passes through the common node 115, is transmitted through its respective bandpass filter 105_1 through 105_N, and exits through individual ports 1-N according to frequency $f_1$ through $f_N$. Each port 1-N (only) outputs its own respective frequency $f_1$ through $f_N$ because of the filtering by the respective bandpass filters 105_1 through 105_N. In other words, port 1 outputs microwave signal 305_1 at frequency $f_1$ (via bandpass filter 105_1), while bandpass filter 105_1 blocks frequencies $f_2$-$f_N$. Port 2 outputs microwave signal 305_2 at frequency $f_2$ (via bandpass filter 105_2), while bandpass filter 105_2 blocks frequencies $f_1$, $f_3$-$f_N$. Similarly, port N outputs microwave signal 305_N at frequency $f_N$ (via bandpass filter 105_N), while bandpass filter 105_N blocks frequencies $f_1$-$f_{N-1}$.

In FIG. 11, each port 1 through port N with its respective transmission line 30 (and respective bandpass filter 105_1 through 105_N) is considered a different/separate channel/output, and common port 120 is a common channel/input. Accordingly, when operating as a power distributer, multiple output channels of ports 1 through N are connected to the (single) common (input) channel of common port 120.

As can be recognized in FIGS. 10 and 11, the device 1000 is configured to be operated as both a microwave signal distributer and combiner according to whether the ports 10 or 120 receive input of the microwave signals 305.

Figure 12:
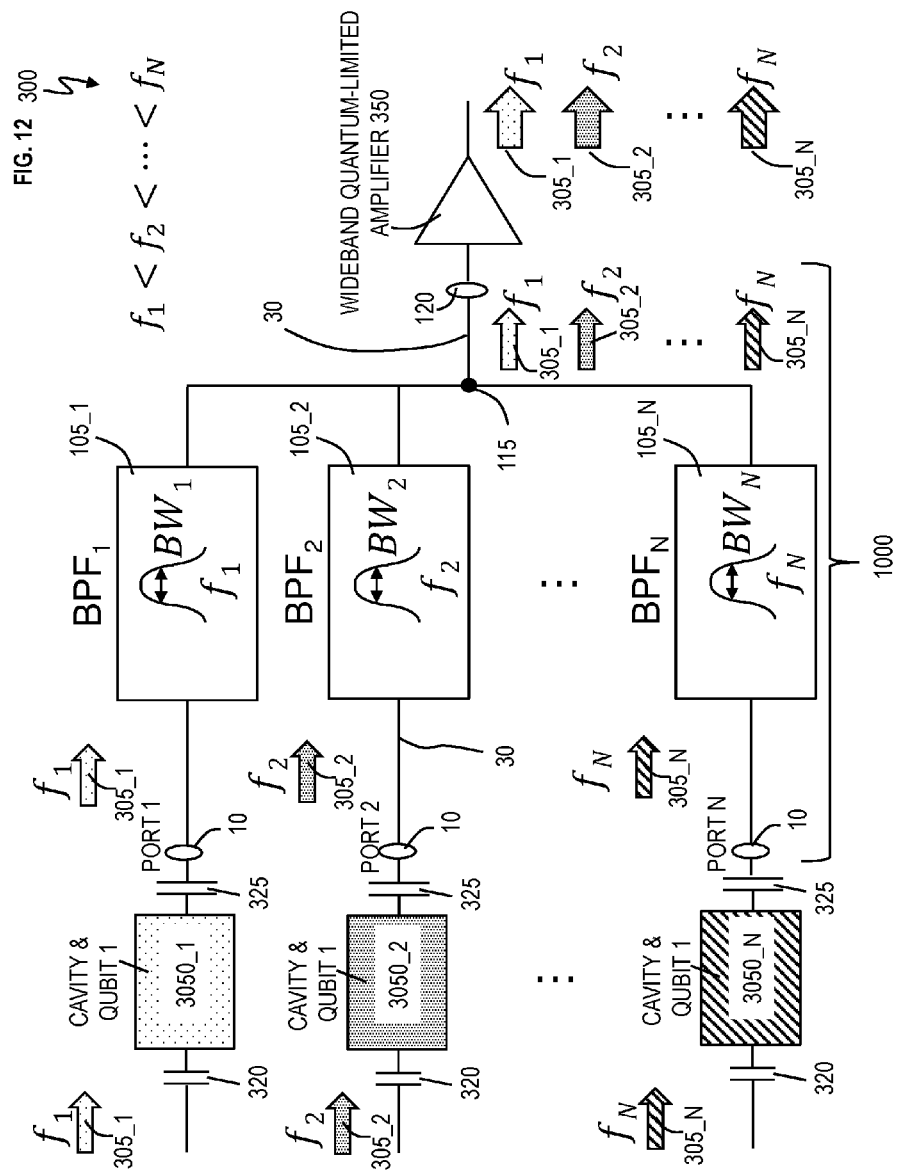
FIG. 12 is a system depicting the device utilized in a quantum system application according to one or more embodiments.

FIG. 12 is a system 300 depicting the device 1000 utilized in a quantum system application according to one or more embodiments. FIG. 12 is an example application of the device 1000 depicting frequency-multiplexed readout of qubits by having the microwave signals 305_1 through 305_N with frequencies $f_1$-$f_N$ that match or nearly match the respective resonance frequencies of the cavities/resonators 1-N. It should be appreciated that the example can be equally applied to drive the qubit by instead having the microwave signals 305_1 through 305_N with frequencies $f_1$-$f_N$ that match or nearly match the respective resonance frequencies of the qubits 1-N.

In the system 300, quantum systems 3050_1 through 3050_N are respectively connected to the (input) ports 1 through port N. The quantum systems can be generally referred to as quantum systems 3050. The quantum system 3050_1 can be a cavity and qubit 1 operatively coupled together. The quantum system 3050_2 can be a cavity and qubit 2 operatively coupled together. Similarly, the quantum system 3050_N can be a cavity and qubit N operatively coupled together. In the quantum system 3050, the cavity and qubit can be capacitively connected, can be connected in a two-dimensional cavity, and/or can be connected in a three-dimensional cavity as understood by one skilled in the art. One type of qubit is a superconducting qubit containing at least one Josephson junction, where a Josephson junction is a nonlinear non-dissipative inductor formed of two superconducting metals (e.g., aluminum, niobium, etc.) sandwiching a thin insulator such as, for example, aluminum oxide, niobium oxide, etc.

In one implementation, the system 300 can also include a wideband quantum-limited amplifier 350 connected to the (output) common port 120. The wideband quantum-limited amplifier 350 has a wide bandwidth designed to amplify all the microwave signals 305 having respective frequencies $f_1$ through $f_N$.

Each quantum system 3050 is designed to resonate at its own resonance frequency which is different for each quantum system 3050. One skilled in the art recognizes that the cavity in each quantum system 3050 is or operates as a resonator, such that the cavity resonates at its own resonance frequency, typically called a readout resonator frequency. Particularly, the cavity in the quantum system 3050_1 is configured to resonate at its resonance frequency, for example, which is frequency $f_1$. The cavity in the quantum system 3050_2 is configured to resonate at its resonance frequency which is frequency $f_2$. Similarly, the cavity in the quantum system 3050_N is configured to resonate at its resonance frequency which is frequency $f_N$.

The quantum systems 3050 are coupled to the device 1000 via capacitors 325, and the quantum systems 3050 are coupled to the external environment via capacitors 320. The external environment can include microwave signal generation equipment.

During frequency-multiplexed readout of the respective qubit in the quantum system 3050_1 in the system 300, the microwave signal 305_1 at frequency $f_1$ is at the resonance frequency for the cavity in the quantum system 3050_1, and the microwave signal 305_1 is at the frequency $f_1$ to target the both port 1 and the bandpass filter 105_1 (because the bandpass filter 105_1 is designed to pass frequency $f_1$). During frequency-multiplexed readout of the respective qubit in the quantum system 3050_2, the microwave signal 305_2 at frequency $f_2$ is at the resonance frequency for the cavity in the quantum system 3050_2, and the microwave signal 305_2 is at the frequency $f_2$ to target the both port 2 and the bandpass filter 105_2 (because the bandpass filter 105_2 is designed to pass frequency $f_2$). During frequency-multiplexed readout of the respective qubit in the quantum system 3050_N, the microwave signal 305_N at frequency $f_N$ is at the resonance frequency for the cavity in the quantum system 3050_N, and the microwave signal 305_N is at the frequency $f_N$ to target the both port N and the bandpass filter 105_N (because the bandpass filter 105_N is designed to pass frequency $f_N$). The microwave signals 305_1 through 305_N at the respective resonance frequencies $f_1$ through $f_N$ cause the quantum systems 3050_1 through 3050_N to respectively resonate, and therefore, the microwave signals 305 (at the respective resonance frequencies) cause the readout of the respective qubits coupled to their respective cavity (resonator). As such, the microwave signal 305_1 after interacting with the quantum system 3050_1 (i.e., the qubit-resonator) is transmitted through port 1, to the bandpass filter 105_1, through the common port 120, and to the wideband quantum-limited amplifier 350. The microwave signal 305_2 after interacting with the quantum system 3050_2 (i.e., the qubit-resonator) is transmitted through port 2, to the bandpass filter 105_2, through the common port 120, and to the wideband quantum-limited amplifier 350. Similarly, the microwave signal 305_N after interacting with the quantum system 3050_N (i.e., the qubit-resonator) is transmitted through port N, to the bandpass filter 105_N, through the common port 120, and to the wideband quantum-limited amplifier 350. After interacting with the respective quantum system 3050_1 through 3050_N, each of the microwave signals 305_1 through 305_N contains quantum information (e.g., the state) of the respective qubits. Each of the microwave signals 305_1 through 305_N are (simultaneously) amplified by the wideband quantum-limited amplifier 350.

The quantum signal is a microwave signal. It should be recognized that the microwave signal 305 can be bi-directionally transmitted in the device 1000.

Figure 13:
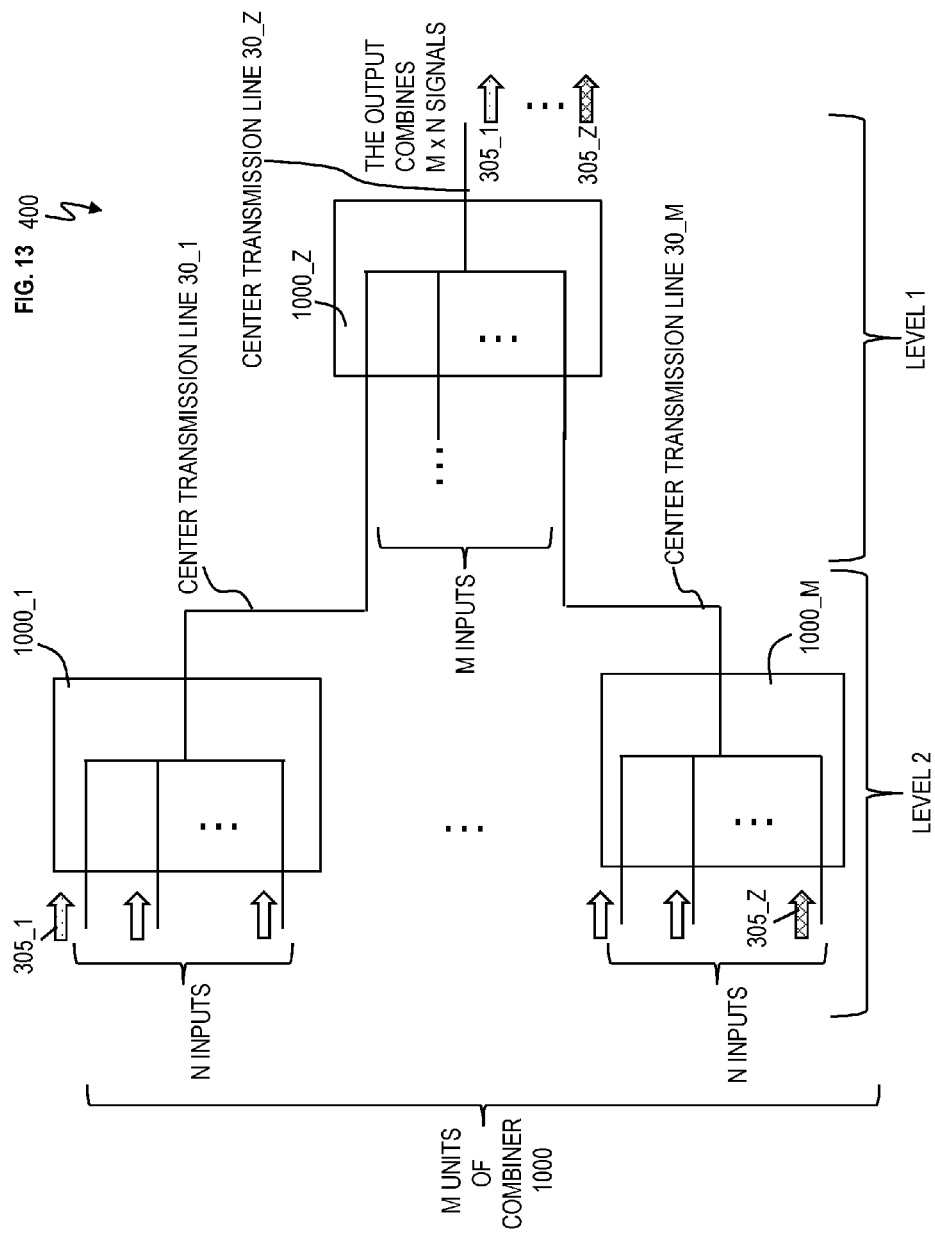
FIG. 13 illustrates devices as a cascading tree of power combiners according to one or more embodiments.

FIG. 13 illustrates devices 1000 as a cascading tree of power combiners according to one or more embodiments. FIG. 13 is an example of scaling up the devices 1000. The devices 1000 are configured to be fabricated on a wafer, for example, as a chip. So as not to unnecessarily obscure the FIG. 13, some details of the devices 1000 have been omitted for the sake of clarity. It is understood that these details are included by analogy as discussed herein.

In this example, the tree of power combiners is depicted with 2 levels. In other implementations, there can be 3, 4, 5 . . . 10 or more levels in the tree of power combiners. In FIG. 13, there can be M units of the devices 1000 in level 2, and the M units of devices 1000 each have N inputs in level 2. Having N inputs means that each device 1000 in level 2 has the corresponding number of N ports 10 connected to their respective one of the N bandpass filters 105. As discussed herein, each of the N inputs has a single port 10 and single bandpass filter 105 on a one-to-one basis. In level 2, the devices 1000 have bandpass filters 105 in which each of the bandpass filters 105 has a different passband (i.e., a different frequency band) as discussed herein, such that there is no overlap in their coverage of frequencies.

Each of the power combiner devices 1000_1 through 1000_M is configured to output microwave signals 305 on its respective center transmission line 30_1 through 30_M. The designation of transmission line 30_1 through 30_M is utilized to show that each one of the power combiner devices 1000_1 through 1000_M has its own output transmission line 30, and accordingly, the total number of center transmission lines 30 from the devices 1000 in level 2 is equal to M. In level 1, the device 1000_Z has M number of inputs. The output of each device 1000_1 through 1000_M is individually connected to its own one of the M number of inputs of the device 1000_Z, such that each of the center transmission lines 30_1 through 30_M is one of the M inputs of the device 1000_Z.

The device 1000_Z is identical to the devices 1000 discussed herein. However, the device 1000_Z is structured such that each of the M inputs has its own connected bandpass filter 105 in level 1 with a passband that covers all of the passbands of the bandpass filters 105 in the lower level 2 per center transmission line 30. For example, in level 1 of the tree 400, device 1000_Z has a first input (of the M inputs) with port 1 so that its bandpass filter 105 in level 1 includes all of the passbands of the bandpass filters in the device 1000_1 in the level 2. Similarly, in level 1 of the tree 400, device 1000_Z has a second input (of the M inputs) with port 2 so that its bandpass filter 105 in level 1 includes all of the passbands of the bandpass filters in the device 1000_2 (not shown) in the level 2. Through the last input (of the M inputs) in level 1 of the tree 400, device 1000_Z has a last input with port N so that its bandpass filter 105 in level 1 includes all of the passbands of the bandpass filters in the device 1000_M in the level 2.

In level 1, the device 1000_Z is configured to receive the microwave signal 305_1 through 305_Z on the M inputs and combine the microwave signals 305_1 through 305_Z to be output on the center transmission line 30_Z. Accordingly, the tree 400 of power devices is scaled up such that the level 1 device 1000_Z outputs M×N microwave signals 305 which correspond to M units of the devices 1000 in level 2 each of the devices 1000 in level 2 having N inputs. The direction of the microwave signals 305_1 through 305_Z shows the tree 400 operating as a scaled-up power combiner. Analogously, the direction of the microwave signals 305_1 through 305_Z can be switched to operate as a scaled-up signal distributer.

Figure 14:
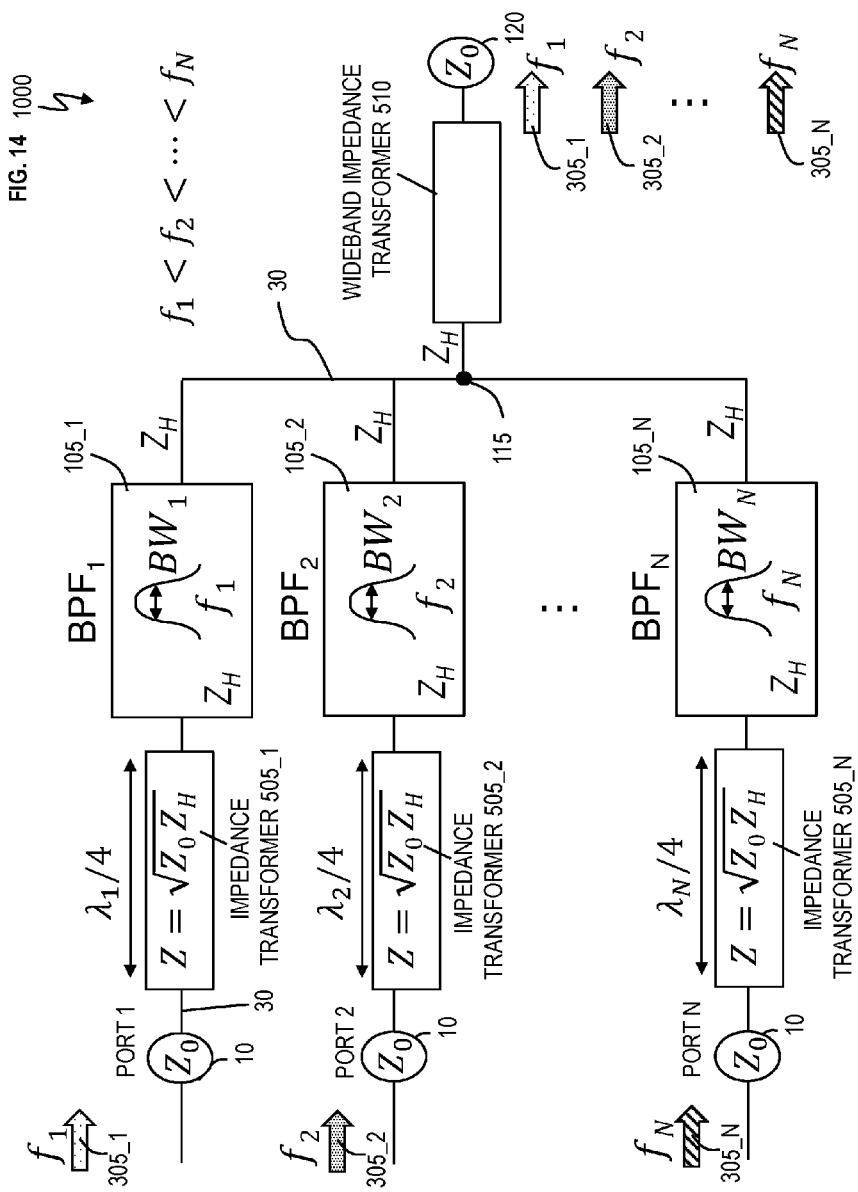
FIG. 14 is a schematic of the device depicting a microwave combiner for quantum signals according to one or more embodiments.

FIG. 14 is a schematic of the device 1000 depicting a microwave combiner for quantum signals according to one or more embodiments. The device 1000 includes all the various features discussed herein. Further, the device 1000 includes additional features to ensure impedance matching for the passing microwave signals (i.e., minimize reflections along the signal path), and also enable the connection of multiple branches/lines to the common node 115.

In FIG. 14, impedance transformers 505_1 through 505_N are respectively added between the respective ports 1 through N and their associated bandpass filters 105_1 through 105_N. Also, the device 1000 includes a wideband impedance transformer 510 connected to the common node 115 and the common port 120. The impedance transformers 505_1 through 505_N and impedance transformer 510 are configured to provide impedance matching. On one end of the device 1000, the impedance transformers 505_1 through 505_N are structured to match (or nearly match) the input impedance $Z_0$ of the ports 1-N and to match the associated bandpass filter 105_1 through 105_N. Each of the impedance transformers 505_1 through 505_N is configured with a characteristic impedance $Z=\sqrt{Z_0 Z_H}$, where $Z_0$ is the input impedance (as well as the output impedance), where $Z_H$ is the high impedance of the bandpass filters 105_1 through 105_N, and where Z is the average impedance of each impedance transformers 505_1 through 505_N. The average characteristic impedance Z is the square root of the product of $Z_0$ and $Z_H$. One reason why transforming the impedance of the device ports $Z_0$ to high characteristic impedance $Z_H$ in the region of the common node can be useful, is because, in general, high impedance transmission lines, such as a microstip or stripline, have narrow traces which in turn minimize the physical size of the common node and allows more lines to be joined together at that node. This is particularly relevant if the bandpass filters are implemented as coupled-line filters and/or capacitively-coupled resonators. If, however, all filters are implemented using lumped-elements (with a very small footprint), such impedance transformations might be less of a concern.

In one implementation, the impedance transformers 505_1 through 505_N can be impedance matching transmission lines where one end (e.g., left end) has a wide width matching the input impedance $Z_0$ and the opposite end (e.g., right end) has a narrow width matching the high impedance $Z_H$ of the bandpass filters 105. Each of the impedance matching transformers 505_1 through 505_N has a length according to its own respective relationship $\lambda_1/4$, $\lambda_2/4, \ldots, \lambda_N/4$, where $\lambda_1$ is the wavelength of the microwave signal 305_1, where $\lambda_2$ is wavelength of the microwave signal 305_2, through $\lambda_N$ which is the wavelength of the microwave signal 305_N. These impedance transformers have in general narrow bandwidths.

In one implementation, the wideband impedance transformer 510 can be an impedance matching transmission line where one end (e.g., left end) has a narrow width matching the high impedance $Z_H$ of the bandpass filters 105 (via common node 115) while the opposite end (e.g., right end) has a wide width matching the output impedance $Z_0$. Such a wideband impedance transformer 510 can be implemented using tapered transmission lines, for example, transmission lines whose widths are changed adiabatically on the scale of the maximum signal wavelength. Other implementations of tapered lines known to one skilled in the art are possible as well, such as the Exponential Taper or the Klopfenstein Taper. Also, it should be noted that the wideband requirement for this impedance transformer versus the other transformers 505, arises from the fact that this wideband transformer needs to match the characteristic impedance for a wideband of signal frequencies transmitted through it, in contrast to the impedance transformers 505 which need only to match the impedance for a narrow frequency range centered around the corresponding center frequency of the bandpass.

The impedance transformers 505_1 through 505_N and impedance transformer 510 are made of superconducting material as discussed herein, such as, for example, niobium, aluminum, tantalum, etc.

The impedance designation $Z_0$ is the characteristic impedance at ports 10 and 120 (which can be the input and output ports or vice versa). For example, the characteristic impedance $Z_0$ can be 50 ohms ($\Omega$) at each port 10 and 120 as recognized by one skilled in the art.

A method of configuring a superconducting microwave combiner device 1000 is provided according to one or more embodiments. Reference can be made to FIGS. 10-14. A first filter 105_1 through a last filter is provided. The first filter 105_1 through the last filter 105_N connect to a first input through a last input (e.g., transmission line 30 individually connected to respective ports 10), respectively. The first filter 105_1 through the last filter 105_N each has a first passband through a last passband (respectively including frequencies $f_1$-$f_N$), respectively, such that the first passband through the last passband are each different. A common output (e.g., transmission line 30 connected to common port 120) connected to the first input through the last input via the first filter 105_1 through the last filter 105_1. The first input through the last input are each isolated from one another, thereby avoiding signal leakage among the first input through the last input. The first filter through the last filter is each configured to transmit signals (e.g., microwave signals 305_1-305_N) at a different set of frequencies. The first filter through the last filter (e.g., bandpass filters 105_1-

105_N) is each passive thereby requiring no operational power to operate as passive filters, and requiring no power gain.

The first filter 105_1 of the first filter through the last filter is configured to only pass the signals at a first set of frequencies, the next filter 105_2, of the first filter through the last filter is configured to only pass the signals at a next set of frequencies, and the last filter 105_N of the first filter through the last filter is configured to only pass the signals at a last set of frequencies. Each of the first set, next set, and last set of frequencies are non-overlapping (i.e., the passbands do not overlap).

The first input through the last input include a first port (e.g., port 1) through a last port (e.g., port N), respectively. The first port 1 through the last port N are operatively connected to the first filter 105_1 through the last filter 105_N, respectively, such that a first through last signals (e.g., microwave signals 305_1-305_N or microwave signals 305_1-305_Z in FIG. 13) respectively input through the first port through the last port are to be combined and output through a common port 120. A first impedance transformer 505_1 through a last impedance transformer 505_N are respectively connected in between the first port 1 through the last port N and the first filter 105_1 through the last filter 105_N. The first impedance transformer through the last impedance transformer is configured to provide impedance matching as discussed in FIG. 14. A common impedance transformer 510 is connected between the first filter 105_1 through the last filter 105_N and the common port 120, and the common impedance transformer 510 is configured to provide impedance matching. The first filter through the last filter is superconducting, and the first filter through the last filter including superconducting materials.

A method is provided of configuring a superconducting microwave distributer device 1000 according to one or more embodiments. Reference can be made to FIGS. 11-14. The superconducting microwave distributer and the superconducting microwave combiner are the same device. However, the microwave distributer and combiner operate in opposite directions as discussed. Particularly, the input ports and output ports are utilized in reverse order with respect to input and output microwave signals 305. A first filter through a last filter is provided. The first filter 105_1 through the last filter 105_N connect to a first output through a last output (e.g., transmission line 30 individually connected to respective ports 10), respectively. The first filter 105_1 through the last filter 105_N has a first passband through a last passband (respectively including frequencies $f_1$-$f_N$), respectively, such that the first passband through the last passband are each different. A common input (e.g., transmission line 30 connected to common port 120) is connected to the first output through the last output via the first filter 105_1 through the last filter 105_N.

The first output through the last output is each isolated from one another, thereby avoiding signal leakage among the first output through the last output. The first filter through the last filter is each configured to transmit signals (e.g., microwave signals 305_1-305_N) at a different set of frequencies. The first filter through the last filter (e.g., bandpass filters 105_1-105_N) is each passive thereby requiring no operational power to operate as passive filters, and generating no power gain. The first filter 105_1 of the first filter through the last filter is configured to only pass the signals at a first set of frequencies, the next filter 105_2, of the first filter through the last filter is configured to only pass the signals at a next set of frequencies, and the last filter 105_N of the first filter through the last filter is configured to only pass the signals at a last set of frequencies. Each of the first set, next set, and last set of frequencies are non-overlapping (i.e., the passbands do not overlap). The first output through the last output include a first port (e.g., port 1) through a last port (e.g., port N), respectively. The first port 1 through the last port N are operatively connected to the first filter 105_1 through the last filter 105_N, respectively, such that a first through last signals (e.g., microwave signals 305_1-305_N or microwave signals 305_1-305_Z in FIG. 13) respectively output through the first port through the last port. The first through last signals (e.g., microwave signals 305_1-305_N or microwave signals 305_1-305_Z in FIG. 13) are together input through a common port 120 at different frequencies. A first impedance transformer 505_1 through a last impedance transformer 505_N are respectively connected in between the first port 1 through the last port N and the first filter 105_1 through the last filter 105_N. The first impedance transformer through the last impedance transformer is configured to provide impedance matching as discussed in FIG. 14. A common impedance transformer 510 is connected between the first filter 105_1 through the last filter 105_N and the common port 120, and the common impedance transformer 510 is configured to provide wideband impedance matching. The first filter through the last filter is superconducting, and the first filter through the last filter includes superconducting materials.

One or more embodiments include a superconducting system 300. A first filter 105_1 through the last filter 105_N is configured to connect to the first quantum system 3050_1 through the last quantum system 3050_N, respectively. The first filter through the last filter has a first passband through a last passband (respectively including frequencies $f_1$-$f_N$), respectively, such that the first passband through the last passband are each different. A common output (e.g., transmission line 30 connected to common port 120) is connected to the first quantum system 3050_1 through the last quantum system 3050_N via the first filter 105_1 through the last filter 105_N.

The first quantum system 3050_1 through the last quantum system 3050_N is configured to resonate at a first resonance frequency (e.g., frequency $f_1$) through a last resonance frequency ($f_N$). The first filter through the last filter are configured to operate in transmission (pass/transmit the signal) for the first resonance frequency through the last resonance frequency respectively, such that each of the first filter through the last filter is associated with (only) one of the first resonance frequency $f_1$ through the last resonance frequency $f_N$. The first filter through the last filter are configured to operate in reflection (i.e., to block) for any other ones of the first resonance frequency through the last resonance frequency except the associated one of the first resonance frequency through the last resonance frequency. In other words, the frequencies $f_1$-$f_N$ are selected to match/overlap its own one of the quantum system 3050_1-3050_N resonance frequency on a one-to-one basis.

Technical effects and benefits include techniques and devices which separate the microwave signals based on their frequency thereby allowing the device to multiplex the readout and drive of multiple qubits without attenuating the microwave signals used in the drive and/or readout. Technical benefits further include isolation between the different ports in a power combiner and signal distributor.

Using devices 100 and 1000 discussed herein, one or more embodiments provide methods and systems to minimize the number of input and output lines that are required for the initialization, calculation (or manipulation), and readout of a large number of superconducting qubits.

In many experiments involving superconducting qubits in the state-of-the-art, at least two microwave lines per qubit are needed in a dilution fridge in order to initialize, calculate (or manipulate), and measure these qubits (i.e., using the input and output lines). However, due to the limited space in a dilution fridge and the dilution fridge's limited cooling power, such allocation of lines is not scalable to large quantum processors that contain more than 50 qubits.

According to one or more embodiments, however, the input and output techniques are scalable to more than 500 qubits with a minimal number of input and output lines in one implementation.

Figure 15:
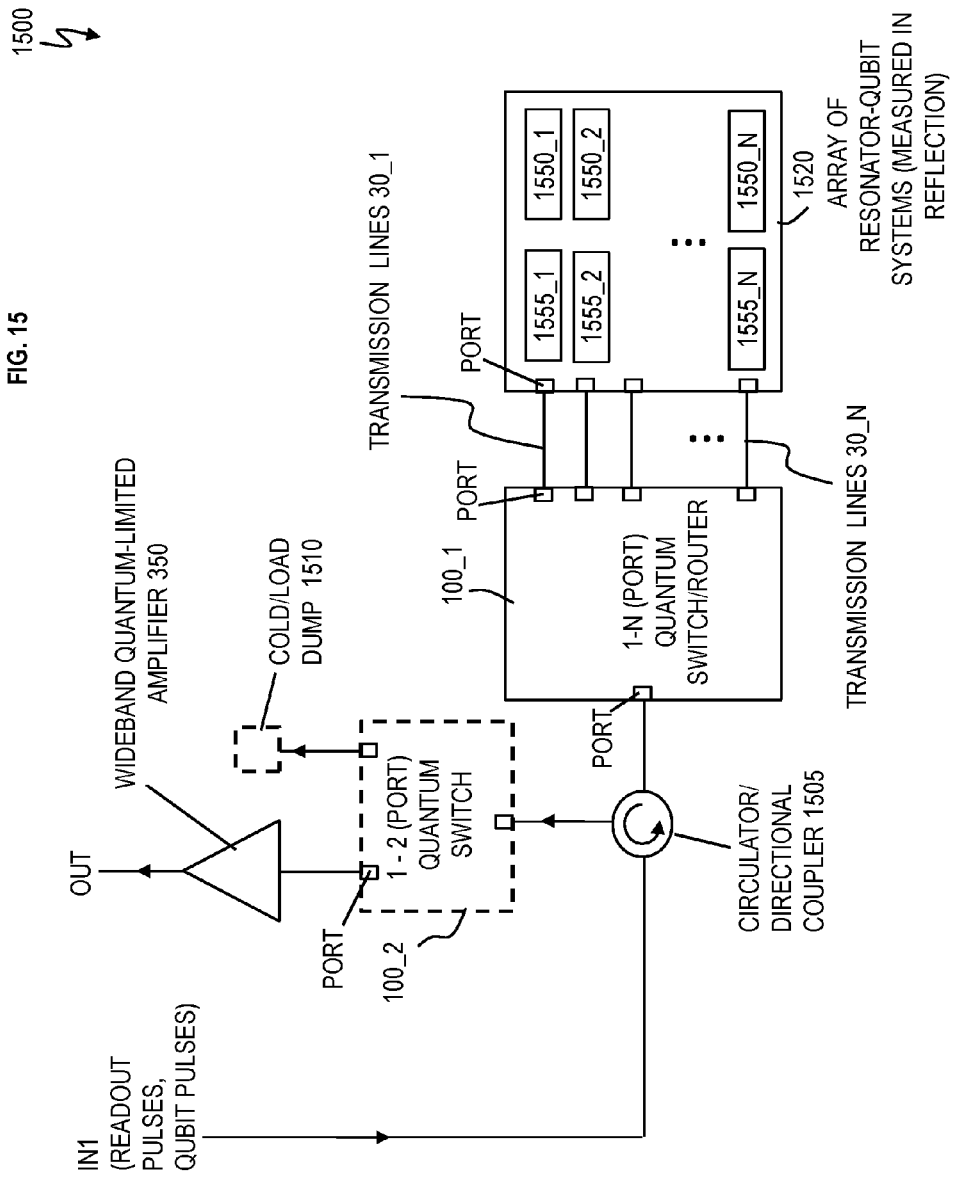
FIG. 15 is a system for qubit drive and qubit readout according to one or more embodiments.

FIGS. 15, 16, 17, and 18 illustrate various systems for driving qubits and reading out qubits according to one or more embodiments. FIG. 15 is a system 1500 for (both) qubit drive and qubit readout according to one or more embodiments. The system 1500 illustrates operating in reflection where the readout of the qubits and the qubit pulses use the same input and output (I/O) lines (i.e., transmission lines).

The system 1500 includes an array of resonator-qubit systems 1520. There are individual qubits 1550_1 through 1550_N (generally referred to as qubits 1550) and readout resonators 1555_1 through 1555_N (readout resonators 1555), respectively. In the array of resonator-qubit systems 1520, there is a one-to-one relationship of a qubit 1550 to its own readout resonator 1555 such that the state of the particular qubit 1550 can be read/inferred by reading its readout resonator 1555. Accordingly, the array of resonator-qubit systems 1520 includes an array of individually addressable qubits 1550_1 through 1550_N connected to their respective (individually addressable) readout resonators 1555_1 through 1555_N, as understood by one skilled in the art. Each readout resonator 1555 in the array of resonator-qubit systems 1520 is designed to resonate at its own readout resonance frequency which is predefined to be different for each readout resonator 1555_1 through 1555_N. Similarly, each individual qubit 1550_1 through 1550_N can be designed to have its own qubit frequency (for driving the qubit) which predefined to be different for each qubit 1550_1 through 1550_N in one implementation. In another implementation, the qubit frequencies do not need to be different, and some of them can be different and some can be the same. One skilled in the art recognizes that a cavity can function as a readout resonator, such that the cavity resonates at its own readout resonance frequency. For example, the resonator-qubit systems 1520 can be an array of cavity-qubit systems 3050_1 through 3050_N discussed in FIG. 12.

The array of resonator-qubit systems 1520 is connected to a superconducting microwave switch/router 100 which is designated as 100_1 because more than one superconducting microwave switch/router is illustrated in FIG. 15. The superconducting microwave switch/router 100_1 is a 1-N quantum switch/router that connects to the array of resonator-qubit systems 1520. As discussed herein, the superconducting microwave switch/router 100_1 is bidirectional. The superconducting microwave switch/router 100_1 is configured with ports that connect to the ports of the array of resonator-qubit systems 1520 via transmission lines 30. Each port of the array of resonator-qubit systems 1520 is individually addressable and/or connected to an individual resonator-qubit system, such that each individual resonator-qubit system can be communicated with. For example, one resonator-qubit system is qubit 1550_1 connected to its readout resonator 1555_1. Another resonator-qubit system is qubit 1550_2 connected to its readout resonator 1555_2, through the last resonator-qubit system which includes qubit 1550_N connected to its readout resonator 1555_N.

In this example, the superconducting microwave switch/router 100_1 has a matching number of ports connected to ports of the array of resonator-qubit systems 1520, and N ports of the superconducting microwave switch/router 100_1 are connected to N ports of the array of resonator-qubit systems 1520 via transmission lines 30_1 through 30_N. The first port of the superconducting microwave switch/router 100_1 and the array of resonator-qubit systems 1520 are connected via transmission line 30_1, while the last port of the superconducting microwave switch/router 100_1 and the array of resonator-qubit systems 1520 are connected via transmission line 30_N.

The system 1500 includes a wideband low-loss circulator 1505 connected to a single port of the 1-N superconducting microwave switch/router 100_1 on one end. The superconducting microwave switch/router 100_1 has one port on one end and N ports on the other end, where either end can function as input and output. The one port is configured to direct a signal to the 1-N ports via associated tunable filters 20 as discussed herein in FIGS. 1-9. Each of the N ports in the 1-N superconducting microwave switch/router 100_1 has an associated tunable filter 20, for a total of N tunable filters 20, i.e., one per transmission line 30_1 through 30_N. The wideband low-loss circulator 1505 is connected to the one port of the superconducting microwave switch/router 100_1, while the 1-N ports of the superconducting microwave switch/router 100_1 are connected to the other end of the array of resonator-qubit systems 1520. The wideband low-loss circulator 1505 can be made of superconducting materials. The wideband low-loss circulator 1505 is wideband because it is structured to cover/direct the frequencies covered in each of the tunable filters 20 in the 1-N ports of the superconducting microwave switch/router 100_1.

In FIG. 15, the system 1500 includes another superconducting microwave switch/router 100 which is designated as 1-2 superconducting microwave switch/router 100_2 (quantum switch) because the superconducting microwave switch/router 100_2 has 1 port connected/connectable to 2 other ports via 2 tunable filters 20 as discussed herein. The wideband low-loss circulator 1505 is connected to the 1 port of the superconducting microwave switch/router 100_2, while the other 2 ports of the superconducting microwave switch/router 100_2 are individually connected to a cold load/dump 1510 and a wideband quantum-limited directional amplifier 350. The wideband quantum-limited directional amplifier 350 amplifies the reflected readout signal containing the quantum information of the respective qubit in the array of resonator-qubit systems 1520. The cold load/dump 1510 can be a 50 ohm ($\Omega$) environment in which the outgoing qubit drive/pulses are applied to, and the qubit pulses are the qubit drive pulses utilized to drive the desired qubit in the array of resonator-qubit systems 1520. The superconducting microwave switch/router 100_1 and 100_2 represent two separate superconducting microwave switch/routers in system 1500, and their details can be found in the superconducting microwave switch/router 100 discussed in FIGS. 10-14.

Now, an example is discussed of qubit pulses to drive the qubits by driving the qubits with time-multiplexed microwave signals, such as microwave signals 305 discussed above. The array of resonator-qubit systems 1520 includes qubit 1550_1 through qubit 1550_N individually connected to its own readout resonator 1555_1 through 1555_N, where qubit 1550_1 is connected (e.g., capacitively or inductively) to its readout resonator 1555_1, qubit 1550_2 is connected to its readout resonator 1555_2, through qubit 1550_N which is connected to its readout resonator 1555_N. The transmission line 30_1 connects to qubit 1550_1 and readout resonator 1555_1 in the array of resonator-qubit systems 1520. The transmission line 30_2 connects to qubit 1550_2 and readout resonator 1555_2 in the array of resonator-qubit systems 1520. Similarly, the transmission line 30_N connects to qubit 1550_N and readout resonator 1555_N in the array of resonator-qubit systems 1520

In one implementation in which each qubit 1550_1 through 1550_N can have its own qubit frequency (i.e., each qubit frequency is different), each qubit 1550_1 through 1550_N can be individually driven. In another implementation, some of the qubit frequencies can be the same and some are not, and each qubit 1550_1 through 1550_N can be individually driven because an operator (or a controller) is able to drive different qubits by using time-division multiplexed drives. By controlling the 1-N quantum switch 100_1, the operator (controller) is able to match each drive or readout pulse (which is sent at different times) to the corresponding qubit-readout system. The following discussion is for the first microwave signal at the qubit frequency (e.g., to drive qubit 1550_1 at time t1), but applies by analogy to microwave signals at the respective qubit frequencies to drive qubits 1550_2 through 1550_N. At input IN1, to drive the desired qubits 1550, microwave signals are transmitted to the array of resonator-qubit systems 1520 using time-division multiplexing. For example, a first microwave signal at the qubit frequency to drive qubit 1550_1 is transmitted at time t1 on transmission line 30_1, a second microwave signal at the qubit frequency to drive qubit 1550_2 is transmitted at time t2 on transmission line 30_1, through a last microwave signal at the qubit frequency to drive qubit 1550_N is transmitted at time tN on transmission line 30_N. In one implementation, the times for transmitting the microwave signals can have the relationship where time t1<t2<tN. In another implementation, the times can be in a different time ordering depending on the operation. Regardless of the time ordering, the idea is that at each given time no more than one qubit-readout system is accessed or addressed in FIG. 15.

The first microwave signal at the qubit frequency to drive qubit 1550_1 is transmitted to the wideband circulator/directional coupler 1505, which directs the first microwave signal to the 1-N quantum switch/router 100_1. The 1-N quantum switch/router 100_1 is configured (via a tunable filter 20) to route the first microwave signal via transmission line 30_1 to the qubit 1550_1 in the array of resonator-qubit systems 1520. Each tunable filter 20 in the 1-N quantum switch/router 100_1 is configured in advance or on the fly to route a particular one of the first through last microwave signals according to the performed operation to the respective one of the qubits 1550, such that each microwave signal is routed to its corresponding qubit 1550 with a matching qubit frequency. Accordingly, there is a tunable filter 20 connected to a respective transmission line 30_1 through 30_N such that one tunable filter 20 is configured to route the intended microwave signal to its intended (one) qubit 1550 because the qubit frequency meets the transmission of the tunable filter 20 connected to the intended qubit 1550. Each transmission line 30_1 through 30_N is connected to a respective tunable filter 20. The qubit 1550_1 is driven to a state by the first microwave signal at the qubit frequency for qubit 1550_1 because the microwave signal at the qubit frequency for qubit 1550_1 has been routed on transmission line 30_1 by the 1-N quantum switch/router 100_1 to qubit 1550_1.

Similarly, at input IN1, to drive the qubit 1550_2, a second microwave signal at the qubit frequency matching the qubit 1550_2 is transmitted at time t2 to the wideband circulator/direction coupler 1505, which then directs the second microwave signal to the 1-N quantum switch/router 100_1, and the 1-N quantum switch/router 100_1 routes the second microwave signal via the tunable filter 20 (configured to pass the qubit frequency of the qubit 1550_2) to the qubit 1550_2 in the array of resonator-qubit systems 1520. The qubit 1550_2 is driven to a state by the second microwave signal at the matching qubit frequency for qubit 1550_2 because the microwave signal at the qubit frequency for qubit 1550_2 has been routed on transmission line 30_2 by the 1-N quantum switch/router 100_1 to qubit 1550_2. As noted above, the time t2 can be before t1 or after t1, and/or before tN or after tN (depending on the operation sequence in the processing).

Likewise, to drive the qubit 1550_N, at input IN1, a last microwave signal at the qubit frequency matching the qubit 1550_N is transmitted at time tN to the wideband circulator/direction coupler 1505, which then directs the last microwave signal to the 1-N quantum switch/router 100_1, and the 1-N quantum switch/router 100_1 routes the last microwave signal via the tunable filter 20 (configured to pass the qubit frequency matching the qubit 1550_N) to the qubit 1550_N in the array of resonator-qubit systems 1520. The qubit 1550_N is driven to a state by the last microwave signal at the qubit frequency for qubit 1550_N because the microwave signal at the qubit frequency for qubit 1550_N has been routed on transmission line 30_N by the 1-N quantum switch/router 100_1 to qubit 1550_N. This time-multiplexed process can be utilized to drive the qubits in FIGS. 15-18.

As discussed above, each individual qubit 1550_1 through 1550_N can be driven by the respective first through last microwave signals to the desired qubits 1550_1 through 1550_N, at a different time t1, t2, . . . tN. Each of the qubits 1550_1 through 1550_N is driven one at a time according to a timing scheme. It is noted that, when the operator (or controller) performs gate operations (cross-resonance gates) between adjacent qubits, the operator (or controller) can send a qubit pulse to a certain qubit at the frequency of one of its neighbors (not its own frequency), which may occur in one implementation. After each qubit 1550_1 through 1550_N is driven, there is a reflected microwave signal. An example case is given for qubit 1550_1 but applies by analogy to qubits 1550_2 through 1550_N. After driving the qubit 1550_1, the first microwave signal at the qubit frequency for qubit 1550_1 is reflected back on transmission line 30_1 to the connected tunable filter 20 in the 1-N quantum switch/router 100_1. Since the tunable filter 20 connected to transmission line 30_1 is configured to pass the first microwave signal of qubit 1550_1, the 1-N quantum switch/router 100_1 outputs the reflected first microwave signal (via the single port) to the wideband circulator/directional coupler 1505. The circulator/directional coupler 1505 directs the reflected (outgoing) first microwave signal up (according to the arrow) to the 1-2 quantum switch 100_2. The quantum switch 100_2 is configured to output the reflected first microwave signal to the cold load/dump 1510, by using its tunable filter 20. The quantum switch 100_2 has 2 tunable filters 20 one connected to pass reflected microwave signals that are drive pulses (as discussed above) to the cold load/dump 1510 and one connected to pass reflected microwave signal that are readout pulses to the wideband quantum-limited amplifier 350 (as discussed further below). As discussed herein, the tunable filters 20 can be tuned to pass or reject desired frequencies via respective flux lines 730.

Now, discussion turns to how to individually read out qubits 1550_1 through 1550_N by reading their respective readout resonators 1555_1 through 1555_N in the array of resonator-qubit systems 1520. Reading out a qubit by reading out its readout resonator to obtain the quantum information (state) of the qubit is understood by one skilled in the art, and one or more embodiments are discussed in system 1500 for readout in reflection mode.

Each readout resonator 1555_1 through readout resonator 1555_N can have its own readout resonator frequency such that each readout resonator frequency is different from one another in the array of resonator-qubit system 1520N in one implementation. In another implementation, the readout resonator frequencies do not need to be different, and some of them can be different and some can be the same because the 1-N quantum switch 100_1 is configured to direct where the microwave signals of the readout pulses directed to. The following discussion is for the first microwave signal at the readout frequency (e.g., to read out readout resonator 1555_1 at time t1'), but applies by analogy to microwave signals at the readout resonator frequencies to read out readout resonator 1555_2 through 1555_N. At input IN1, to drive the desired readout resonators 1555, microwave signals are transmitted to the array of resonator-qubit systems 1520 using time-division multiplexing. For example, a first microwave signal at the readout resonator frequency to read out readout resonator 1555_1 is transmitted at time t1' on transmission line 30_1, a second microwave signal at the readout resonator frequency to read out readout resonator 1555_2 is transmitted at time t2' on transmission line 30_1, through a last microwave signal at the readout resonator frequency to read out readout resonator 1555_N is transmitted at time tN' on transmission line 30_N. The timing is determined by a controller depending on the operation or application performed, and the times are not equal.

At time t1', the first microwave signal at the readout frequency to read (i.e., resonate) readout resonator 1555_1 is transmitted to the wideband circulator/directional coupler 1505, which directs the first microwave signal to the 1-N quantum switch/router 100_1. The 1-N quantum switch/router 100_1 is configured (via tunable filter 20) to route the first microwave signal via transmission line 30_1 to the readout resonator 1555_1 in the array of resonator-qubit systems 1520. Each tunable filter 20 in the 1-N quantum switch/router 100_1 can be configured (in advance and/or on the fly by a controller) to route a particular one of the first through last microwave signals to the respective one of the readout resonators 1555, such that each microwave signal is routed to its corresponding readout resonator 1555. Accordingly, there is a tunable filter 20 connected to a respective transmission line 30_1 through 30_N such that one tunable filter 20 is configured to route the intended microwave signal to its intended (one) readout resonator 1555 because the signal frequency meets the transmission of the tunable filter 20 connected to the intended readout resonator 1555 (as well as the intended qubit 1550 because the qubit signal frequency meets the transmission of the same tunable filter 20 connected to the intended qubit 1550). Each transmission line 30_1 through 30_N is connected to a respective tunable filter 20 in the 1-N quantum switch/router 100_1. Just as the qubit 1550_1 is driven to a state by the first microwave signal sent to qubit 1550_1 because the microwave signal frequency sent to qubit 1550_1 has been routed on transmission line 30_1 by the 1-N quantum switch/router 100_1 to qubit 1550_1, the readout resonator 1555_1 is read by the first microwave signal sent to the readout resonator 1555_1 because the microwave signal at the readout resonator frequency for readout resonator 1555_1 has been routed on transmission line 30_1 by the 1-N quantum switch/router 100_1 to readout resonator 1555_1. In other words, the tunable filter 20 connected to transmission line 30_1 can be tuned to transmit both the qubit drive pulse for qubit 1550_1 and the readout pulse for readout resonator 1555_1, while all other tunable filters 20 in the 1-N quantum switch/router 100_1 reject these frequencies.

Similarly, at input IN1, to read the readout resonator 1555_2, a second microwave signal at the readout resonator frequency is transmitted at time t2' to the wideband circulator/direction coupler 1505, which then directs the second microwave signal to the 1-N quantum switch/router 100_1, and the 1-N quantum switch/router 100_1 routes the second microwave signal via the tunable filter 20 (configured to pass the signal frequency to read the readout resonator 1555_2) to the readout resonator 1555_2 in the array of resonator-qubit systems 1520. The readout resonator 1555_2 is read by the second microwave signal at the readout resonator frequency for readout resonator 1555_2 because the microwave signal at the readout resonator frequency for readout resonator 1555_2 has been routed on transmission line 30_2 by the 1-N quantum switch/router 100_1 to readout resonator 1555_2. Just as the qubit 1550_2 is driven to a state by the first microwave signal sent to qubit 1550_2 because the microwave signal frequency sent to qubit 1550_2 has been routed on transmission line 30_2 by the 1-N quantum switch/router 100_1 to qubit 1550_2, the readout resonator 1555_2 is read (i.e., caused to resonate) by the first microwave signal sent to the readout resonator 1555_2 because the microwave signal at the readout resonator frequency for readout resonator 1555_2 has been routed on transmission line 30_2 by the 1-N quantum switch/router 100_1 to readout resonator 1555_2. In other words, the tunable filter 20 connected to transmission line 30_2 can be tuned to transmit both the qubit drive pulse for qubit 1550_2 and the readout pulse for readout resonator 1555_2, while all other tunable filters 20 in the 1-N quantum switch/router 100_1 reject these frequencies.

Likewise, at input IN1, to read the readout resonator 1555_N, a last microwave signal at the readout resonator frequency is transmitted at time tN' to the wideband circulator/direction coupler 1505, which then directs the last microwave signal to the 1-N quantum switch/router 100_1, and the 1-N quantum switch/router 100_1 routes the last microwave signal via the tunable filter 20 (configured to pass the signal frequency to read the readout resonator 1555_N) to the readout resonator 1555_N in the array of resonator-qubit systems 1520. The readout resonator 1555_N is read by the last microwave signal at the readout frequency for readout resonator 1555_N because the microwave signal at the readout resonator frequency for readout resonator 1555_N has been routed on transmission line 30_N by the 1-N quantum switch/router 100_1 to readout resonator 1555_N. Just as the qubit 1550_N is driven to a state by the first microwave signal sent to qubit 1550_N because the microwave signal frequency sent to qubit 1550_N has been routed on transmission line 30_N by the 1-N quantum switch/router 100_1 to qubit 1550_N, the readout resonator 1555_N is read by the first microwave signal sent to the readout resonator 1555_N because the microwave signal at the readout resonator frequency for readout resonator 1555_N has been routed on transmission line 30_N by the 1-N quantum switch/router 100_1 to readout resonator 1555_N. In other words, the tunable filter 20 connected to transmission line 30_N can be tuned to transmit both the qubit drive pulse for qubit 1550_N and the readout pulse for readout resonator 1555_N, while all other tunable filters 20 in the 1-N quantum switch/router 100_1 reject these frequencies.

As discussed above, each individual readout resonator 1555_1 through 1555_N can be read by the respective first through last microwave signals sent to the desired readout resonator 1555_1 through 1555_N, at a different time t1', t2', ... tN'. Each of the readout resonators 1555_1 through 1555_N is read one at a time according to the timing scheme. After each readout resonator 1555_1 through 1555_N is read (i.e., caused to resonate), there is a reflected microwave signal. An example case is given for readout resonator 1555_1 but applies by analogy to readout resonator 1555_2 through 1555_N. After reading the readout resonator 1555_1, the first microwave signal at the readout resonator frequency for readout resonator 1555_1 is reflected back on transmission line 30_1 to the connected tunable filter 20 in the 1-N quantum switch/router 100_1. Since the tunable filter 20 connected to transmission line 30_1 is configured to pass the first microwave signal at the readout resonator frequency of readout resonator 1555_1, the 1-N quantum switch/router 100_1 outputs the reflected first microwave signal (via the single port) to the wideband circulator/directional coupler 1505. The wideband circulator/directional coupler 1505 directs the reflected (outgoing) first microwave signal up to the 1-2 quantum switch 100_2. The quantum switch 100_2 is configured to output the reflected first microwave signal to the wideband quantum-limited amplifier 350, by passing through the tunable filter 20 connected on the port that outputs to the wideband quantum-limited amplifier 350. As noted above, the quantum switch 100_2 has 2 tunable filters 20 one connected to pass reflected microwave signals that are drive pulses and one connected to pass reflected microwave signals that are readout pulses.

The 1-2 quantum switch 100_2 and the cold load/dump 1510 are optional and shown with dashed lines. In one embodiment, the wideband circulator/directional coupler 1505 can be connected directly to the wideband quantum-limited amplifier 350 and no 1-2 quantum switch 100_2 and the cold load/dump 1510 are present. In this case, the pump drive to the wideband quantum-limited amplifier 350 is turned on when a reflected microwave signal (i.e., reflected readout pulse) from any of the readout resonators 1555_1 through 1555_N is entering the wideband quantum-limited amplifier 350 from the circulator 1505, such that the reflected microwave signals (i.e., reflected readout pulses) from the readout resonators 1555 are amplified. The pump drive to the wideband quantum-limited amplifier 350 is turned off when a reflected microwave signal (i.e., reflected drive/qubit pulse) from any of the qubits 1550_1 through 1550_N is entering the wideband quantum-limited amplifier 350 from the circulator 1505, such that the reflected microwave signals (reflected drive/qubit pulses) from the qubits 1550 are not amplified. The timing scheme is predetermined or dynamically determined by a controller for turning on the pump to the wideband quantum-limited amplifier 350 to amplify the reflected microwave signal (i.e., reflected readout pulse) from the readout resonators 1555 and for turning off the pump when (reflected drive/qubit pulses) are present. The controller may include memory having computer-executable instructions and one or more processors configured to execute the computer executable instructions, in accordance with embodiments discussed herein.

In FIG. 15, the properties of the superconducting quantum switch/router in FIG. 15 can have near unity transmission>−0.04 dB, reflection less than −20 dB, and a large on/off ratio>20 dB. In the design for the system 1500, the superconducting quantum switch/router is lossless, is fast switching (~ns), is scalable to more than two ports, has a large dynamic range>−80 dBm in order to support cross-resonance microwave pulses, and has a wideband (covers the qubit and readout frequencies to be utilized in the array of resonator-qubit systems 1520).

Figure 16:
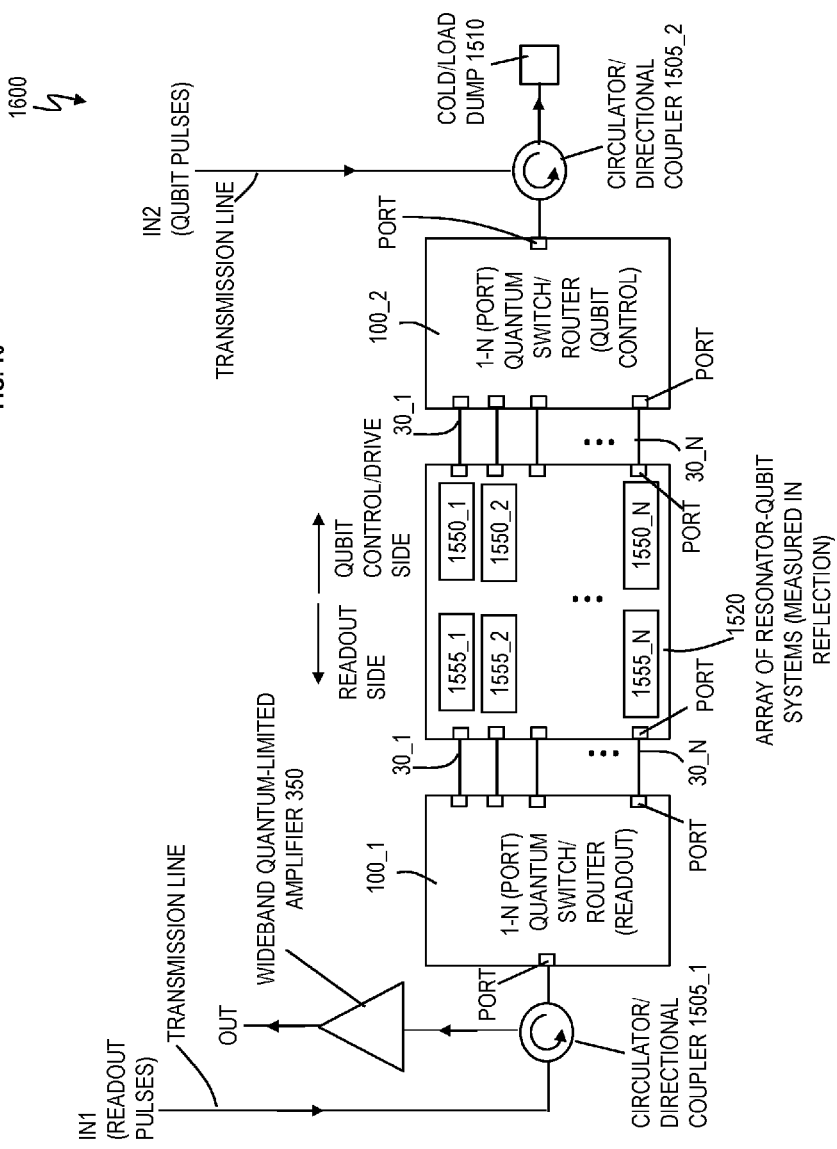
FIG. 16 is a system for qubit drive and qubit readout according to one or more embodiments.

FIG. 16 is a system 1600 for (both) qubit drive and qubit readout according to one or more embodiments. The system 1600 illustrates operating in reflection where the readout of the qubits and the qubit pulses use different input and output (I/O) lines (i.e., transmission lines). In this case, input IN1 is utilized for reading out the readout resonators 1555 while input IN2 is used for driving the qubits 1550. The system 1600 includes the same elements as the system 1500 except the system 1600 does not include the 1-2 quantum switch in FIG. 15. The system 1600 includes two wideband circulator/directional couplers designated as 1505_1 and 1505_2, includes two 1-N quantum switch routers designated as 100_1 and 100_2, and includes two input lines designated as input IN1 and input IN2.

For ease of understanding and not limitation, certain features in the system 1600 are discussed with respect to the readout side and the qubit control/drive side. On the readout side, the input IN1 connects to the wideband circulator/directional coupler 1505_1 through a port, and through another port, the wideband circulator/directional coupler 1505_1 connects to the 1-N quantum switch/router 100_1 utilized for reading out the readout resonators 1555. The 1-N quantum switch/router 100_1 utilized for readout connects to the array of resonator-qubit systems 1520 via transmission lines 30_1 through 30_N as discussed above. The wideband circulator/directional coupler 1505_1 connects to the wideband quantum-limited amplifier 350 when reflecting readout pulses from the readout resonators 1555_1 through 1555_N.

On the qubit control/drive side, the input IN2 connects to the wideband circulator/directional coupler 1505_2 through one port, and through another port, the wideband circulator/directional coupler 1505_2 connects to the 1-N quantum switch/router 100_2 utilized for driving/controlling the qubits 1550. The 1-N quantum switch/router 100_2 utilized for qubit drive/control connects to the array of resonator-qubit systems 1520 via transmission lines 30_1 through 30_N as discussed above. The wideband circulator/directional coupler 1505_2 connects to the cold/load dump 1510 when reflecting drive pulses.

The driving of qubits 1550 and reading out of readout resonators 1555 is analogous to the system 1500 in FIG. 15 except two separate feedlines (transmission lines) are utilized for input IN1 to input the readout pulses and for input IN2 to input the qubit/drive pulses. In the system 1600 of FIG. 16, the following discussion is for the first microwave signal applied to qubit 1550_1 (e.g., to drive qubit 1550_1 at time t1), but applies by analogy to microwave signals at the qubit signal frequencies to drive qubits 1550_2 through 1550_N. At input IN2, to drive the desired qubits 1550, microwave signals are transmitted to the array of resonator-qubit systems 1520 using time-division multiplexing. For example, a first microwave signal to drive qubit 1550_1 is transmitted at time t1 on transmission line 30_1, a second microwave signal to drive qubit 1550_2 is transmitted at time t2 on transmission line 30_1, through a last microwave signal to drive qubit 1550_N is transmitted at time tN on transmission line 30_N.

In FIG. 16, the first microwave signal to drive qubit 1550_1 is transmitted to the wideband circulator 1505_2, which directs the first microwave signal to the 1-N quantum switch/router 100_2. The 1-N quantum switch/router 100_2 is configured (via tunable filter 20) to route the first microwave signal via transmission line 30_1 on the qubit control/drive side to the qubit 1550_1 in the array of resonator-qubit systems 1520. Each tunable filter 20 in the 1-N quantum switch/router 100_1 is configured (e.g., predetermined in advance and/or on the fly by the controller) to route a particular one of the first through last microwave signals according to its qubit signal frequency to the respective one of the qubits 1550, such that each microwave signal is routed to its corresponding qubit 1550. Accordingly, there is a tunable filter 20 connected to a respective transmission line 30_1 through 30_N on the qubit control/drive side such that the tunable filter 20 is configured to route the intended microwave signal to its intended qubit 1550 because the qubit signal frequency meets the transmission of the tunable filter 20 connected to the intended qubit 1550. Each transmission line 30_1 through 30_N is connected to a respective tunable filter 20 of the 1-N quantum switch/router 100_2. The qubit 1550_1 is driven to a state by the first microwave signal sent to qubit 1550_1 because the microwave signal for qubit 1550_1 has been routed on transmission line 30_1 (of the qubit drive side) by the 1-N quantum switch/router 100_2 to qubit 1550_1.

Similarly, at input IN2, to drive the qubit 1550_2, a second microwave signal sent to the qubit 1550_2 is transmitted at time t2 to the wideband circulator/direction coupler 1505_2, which then directs the second microwave signal to the 1-N quantum switch/router 100_2, and the 1-N quantum switch/router 100_2 routes the second microwave signal via the tunable filter 20 (configured to pass the qubit signal frequency of the qubit 1550_2) to the qubit 1550_2 in the array of resonator-qubit systems 1520. The qubit 1550_2 is driven to a state by the second microwave signal for qubit 1550_2 because the microwave signal sent to qubit 1550_2 has been routed on transmission line 30_2 on the qubit drive side by the 1-N quantum switch/router 100_2 to qubit 1550_2.

Likewise, at input IN2, to drive the qubit 1550_N, a last microwave signal sent to the qubit 1550_N is transmitted at time tN to the wideband circulator/direction coupler 1505_2, which then directs the last microwave signal to the 1-N quantum switch/router 100_2, and the 1-N quantum switch/router 100_2 routes the last microwave signal via the tunable filter 20 (configured to pass the qubit signal frequency of the qubit 1550_N) to the qubit 1550_N in the array of resonator-qubit systems 1520. The qubit 1550_N is driven to a state by the last microwave signal for qubit 1550_N because the microwave signal sent to qubit 1550_N has been routed on transmission line 30_N on the qubit drive side by the 1-N quantum switch/router 100_2 to qubit 1550_N.

As discussed above, each individual qubit 1550_1 through 1550_N can be driven on input IN2 (note that the input IN1 was utilized in FIG. 15) on the qubit drive side by the respective first through last microwave signals sent to the desired qubits 1550_1 through 1550_N, at a different time t1, t2, tN. Each of the qubits 1550_1 through 1550_N is driven one at a time according to a timing scheme. After each qubit 1550_1 through 1550_N is driven, there is a reflected microwave signal. As discussed above, an example case is given for qubit 1550_1 but applies by analogy to qubits 1550_2 through 1550_N. After driving the qubit 1550_1, the first microwave signal sent to qubit 1550_1 is reflected back on transmission line 30_1 (on the qubit drive/control side) to the connected tunable filter 20 in the 1-N quantum switch/router 100_2. Since the tunable filter 20 connected to transmission line 30_1 (on the qubit drive side) is configured to pass the frequency of the first microwave signal of qubit 1550_1, the 1-N quantum switch/router 100_2 outputs the reflected first microwave signal (via the single port) to the wideband circulator/directional coupler 1505_2. The wideband circulator/directional coupler 1505_2 directs the reflected (outgoing) first microwave signal to the cold load/dump 1510. However, in contrast to FIG. 15, FIG. 16 utilizes no 1-2 quantum switch because FIG. 16 has separate inputs IN1 and IN2. As discussed herein, the tunable filters 20 can be tuned to pass or reject desired frequencies via respective flux lines 730.

Now, discussion turns to individually reading out qubits 1550_1 through 1550_N by reading their respective readout resonators 1555_1 through 1555_N in the array of resonator-qubit systems 1520, which is accomplished using the input IN1 on the readout side.

The following discussion is for the first microwave signal at the readout frequency (e.g., to read out readout resonator 1555_1 at time t1'), but applies by analogy to microwave signals at the readout resonator frequencies to read out readout resonator 1555_2 through 1555_N. At input IN1, to drive the desired readout resonators 1555, microwave signals are transmitted to the array of resonator-qubit systems 1520 using time-division multiplexing. For example, a first microwave signal at the readout frequency to read out readout resonator 1555_1 is transmitted at time t1' on transmission line 30_1 on the readout side, a second microwave signal at the readout frequency to read out readout resonator 1555_2 is transmitted at time t2' on transmission line 30_1 on the readout side, through a last microwave signal at the readout frequency to read out readout resonator 1555_N which is transmitted at time tN' on transmission line 30_N on the readout side.

At time t1', the first microwave signal at the readout frequency to read readout resonator 1555_1 is transmitted to the wideband circulator 1505_1, which directs the first microwave signal to the 1-N quantum switch/router 100_1. The 1-N quantum switch/router 100_1 is configured (via tunable filter 20) to route the first microwave signal via transmission line 30_1 on the readout side to the readout resonator 1555_1 in the array of resonator-qubit systems 1520. Each tunable filter 20 in the 1-N quantum switch/router 100_1 is configured (e.g., predetermined in advance and/or on the fly by the controller) to route a particular one of the first through last microwave signals according to its readout frequency to the respective one of the readout resonators 1555, such that each microwave signal is routed to its corresponding readout resonator 1555. Accordingly, there is a tunable filter 20 connected to a respective transmission line 30_1 through 30_N on the readout side such that one tunable filter 20 is configured to route the intended microwave signal to its intended (one) readout resonator 1555 because the readout frequency meets the transmission of the tunable filter 20 connected to the intended readout resonator 1555. In FIG. 16, this one tunable filter 20 in the 1-N quantum switch/router 100_1 needs to pass the first microwave signal at the readout frequency of resonator 1555_1 but does not need to be configured to pass any microwave signal having a qubit frequency matching intended qubit 1550_1 connected to the readout resonator 1555_1. Each transmission line 30_1 through 30_N on the readout side is connected to a respective tunable filter 20 in the 1-N quantum switch/router 100_1.

Similarly, at input IN1 on the readout side, to read the readout resonator 1555_2, a second microwave signal at the readout frequency of the readout resonator 1555_2 is transmitted at time t2' to the wideband circulator/direction coupler 1505_1, which then directs the second microwave signal to the 1-N quantum switch/router 100_1. The 1-N quantum switch/router 100_1 routes the second microwave signal via the tunable filter 20 (configured to pass the readout frequency of the readout resonator 1555_2) to the readout resonator 1555_2 in the array of resonator-qubit systems 1520. The readout resonator 1555_2 is read by the second microwave signal at the readout frequency for readout resonator 1555_2 because the microwave signal at the readout frequency for readout resonator 1555_2 has been routed on transmission line 30_2 on the readout side by the 1-N quantum switch/router 100_1 to readout resonator 1555_2.

Likewise, at input IN1 on the readout side, to read the readout resonator 1555_N, a last microwave signal at the readout frequency of the readout resonator 1555_N is transmitted at time tN' to the wideband circulator/direction coupler 1505_1, which then directs the last microwave signal to the 1-N quantum switch/router 100_1. The 1-N quantum switch/router 100_1 routes the last microwave signal via the tunable filter 20 (configured to pass the qubit frequency of the readout resonator 1555_N) to the readout resonator 1555_N in the array of resonator-qubit systems 1520. The readout resonator 1555_N is read by the last microwave signal at the readout frequency for readout resonator 1555_N because the microwave signal at the readout frequency for readout resonator 1555_N has been routed on transmission line 30_N on the readout side by the 1-N quantum switch/router 100_1 to readout resonator 1555_N.

As discussed above, each individual readout resonator 1555_1 through 1555_N can be read by the respective first through last microwave signals having a matching readout frequency to the desired readout resonator 1555_1 through 1555_N, at a different time t1', t2', . . . tN'. Each of the readout resonators 1555_1 through 1555_N is read one at a time according to the timing scheme. After each readout resonator 1555_1 through 1555_N is read (i.e., caused to resonate), there is a reflected microwave signal. An example case is given for readout resonator 1555_1 but applies by analogy to readout resonator 1555_2 through 1555_N. After reading the readout resonator 1555_1, the first microwave signal at the readout frequency for readout resonator 1555_1 of the array of resonator-qubit systems 1520 is reflected back on transmission line 30_1 (on the readout side) to the connected tunable filter 20 in the 1-N quantum switch/router 100_1. Since the tunable filter 20 connected to transmission line 30_1 (on the readout side) is configured (e.g., predetermined in advance and/or on the fly by the controller) to pass the first microwave signal at the readout frequency of readout resonator 1555_1, the 1-N quantum switch/router 100_1 outputs the reflected first microwave signal (via the single port) to the wideband circulator/directional coupler 1505_1. The wideband circulator/directional coupler 1505_1 directs the reflected (outgoing) first microwave signal up to the wideband quantum-limited amplifier 350. As noted above, the 1-N quantum switch/router 100_1 directs reflected microwave signals (i.e., reflected readout pulses from the respective readout resonators 1555_1 through 1555_N) to the wideband quantum-limited amplifier 350 for amplification.

Similarly, each of the reflected microwave signals (which are drive pulses reflected from the respective qubits 1550_1 through 1550_N on to transmission lines 30_1 through 30_N on the qubit drive side) are transmitted from the array of resonator-qubit system 1520 back to the 1-N quantum switch/router 100_2. The 1-N quantum switch/router 100_2 transmits the reflected microwave signals of the drive pulses to the wideband circulator/directional coupler 1505_2, which then directs the reflected microwave signals of the drive pulses to the cold/load dump 1510.

The technical benefits of the system 1600 in FIG. 16 over the system 1500 can include the following. 1) The 1-N quantum switch/router 100_1 on the readout side can be designed differently than the 1-N quantum switch/router 100_2 on the qubit control side. 2) There is no need to route outgoing readout and qubit pulses to different paths and no need to pulse the pump applied to the wideband quantum-limited amplifier. The tradeoff of using the system 1600 (as opposed to the system 1500) is twice (2×) the number of input lines, twice (2×) the number of circulators, and twice (2×) the number 1-N quantum switches/routers.

Figure 17:
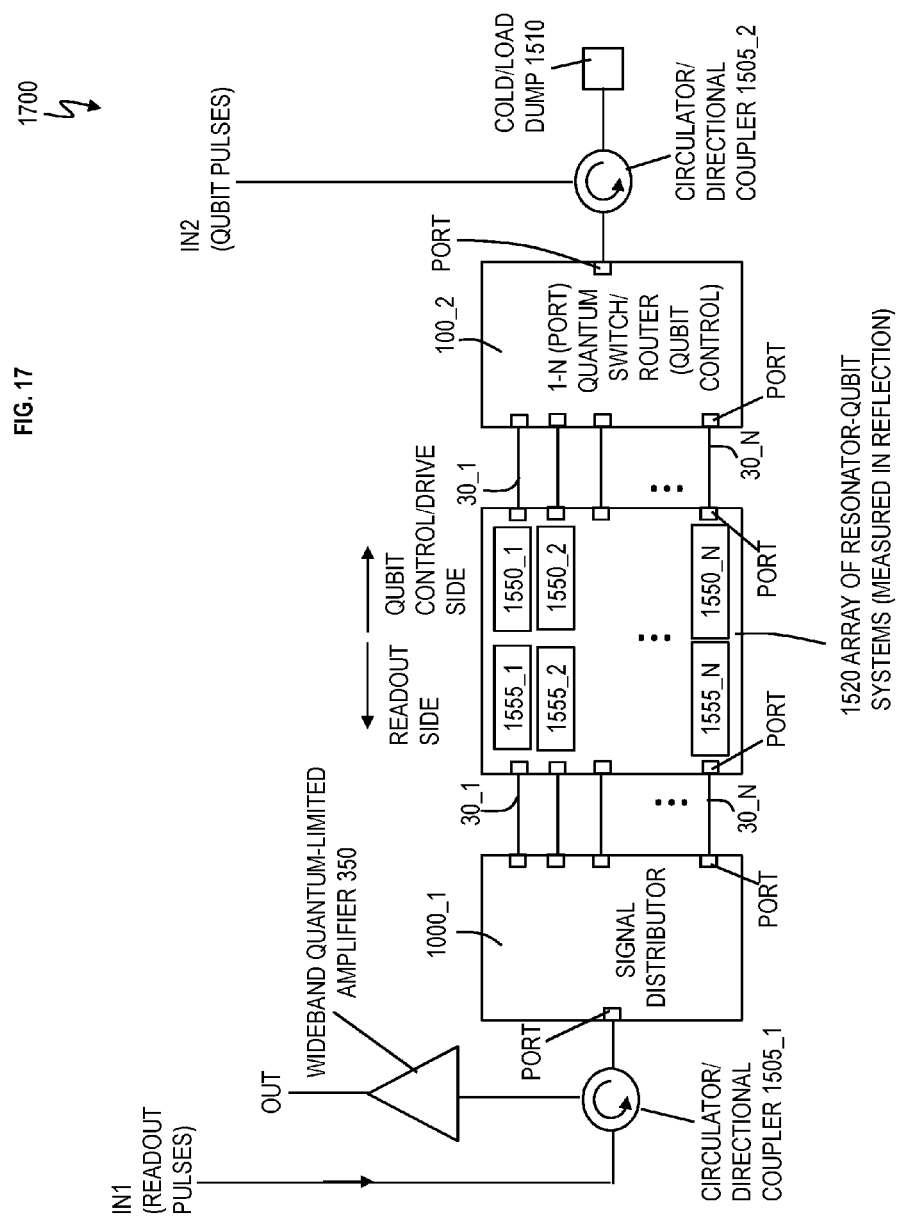
FIG. 17 is a system for qubit drive and qubit readout according to one or more embodiments.

FIG. 17 is a system 1700 for (both) qubit drive and qubit readout according to one or more embodiments. The system 1700 illustrates operating in reflection where the readout of the readout resonators (to read the qubits) with readout pulses and driving/control of the qubits with qubit pulses use different input and output (I/O) lines (i.e., transmission lines).

The operation of inputting the microwave signals as qubit drive pulses which respectively drive qubits 1550_1 through 1550_N in the array of resonator-qubit systems 1520 has been discussed in FIG. 16 and applies to FIG. 17. Similarly, the process of the reflected microwave signals of the qubit drive pulses being transmitted to the cold/load dump 1510 has been discussed in FIG. 16 and applies to FIG. 17.

On the readout side, the signal distributor (combiner) 1000_1 in the system 1700 in FIG. 17 has replaced the 1-N quantum switch/router 100_1 in FIG. 16. In the system 1700, the first through last microwave signals at the readout frequencies (of readout resonators 1555_1 through 1555_N) can all be simultaneously applied via frequency-division multiplexing at input IN1 on the readout side and/or any desired microwave signals at the desired readout frequencies (of readout resonators 1555_1 through 1555_N). The first through last microwave signals at the readout resonator frequencies (of readout resonators 1555_1 through 1555_N) are directed to the wideband circulator/directional coupler 1505_1, which directs the first through last microwave signals at the readout resonator frequencies (of readout resonators 1555_1 through 1555_N) to the signal distributor device 1000_1. The signal distributor device 1000_1 is configured to utilize frequency-division multiplexing to (simultaneously) receive the different readout resonator frequencies for different microwave signals on a single port and configured to (simultaneously) distribute the different readout resonator frequencies for the first through last microwave signals onto multiple transmission lines 30_1 through 30_N connected to the array of resonator-qubit system 1520. The individual bandpass filters 105_1 through 105_N of the signal distributor device 1000_1 are respectively connected (via ports) to transmission lines 30_1 through 30_N (on the readout side), such that bandpass filter 105_1 is connected to transmission line 30_1 (on the readout side) through bandpass filter 105_N connected to transmission line 30_N (on the readout side). Accordingly, in parallel, the signal distributor device 1000_1 is configured to direct the first microwave signal having the readout resonator frequency of readout resonator 1555_1 to the readout resonator 1555_1 via transmission line 30_1, to direct the second microwave signal having the readout resonator frequency of readout resonator 1555_2 to the readout resonator 1555_2 via transmission line 30_2, and to direct the last microwave signal having the readout resonator frequency of readout resonator 1555_N to the readout resonator 1555_N via transmission line 30_N. This is because each of the bandpass filters 105 are individually configured, in advance, to pass an individual one of the readout resonator frequencies (of an individual one of the readout resonators 1555) for microwave signals, such that bandpass filter 105_1 is configured to pass the first microwave signal at the readout frequency of readout resonator 1555_1, bandpass filter 105_2 is configured to pass the second microwave signal at the readout frequency of readout resonator 1555_2, through bandpass filter 105_N which is configured to pass the last microwave signal at the readout frequency of readout resonator 1555_N. Accordingly, each first through last microwave signal respectively at a readout resonator frequency of readout resonators 1555_1 through 1555_N causes its respective one of the readout resonator 1555_1 through 1555_N to resonate, thereby (simultaneously) reflecting the reflected first through the last microwave signals back down the transmission lines 30_1 through 30_N to reach the signal distributor device 1000_1. It should be noted that they can be performed in parallel (simultaneously) but there is no requirement that readout is performed at the same time or that all of them are measured before the second round of measurements. Returning to the example scenario, the signal distributor device 1000_1 combines the reflected first through last microwave signals (at the respective readout resonator frequencies of readout resonator 1555_1 through 1555_N) and outputs the combined reflected microwave signals to the wideband circulator/directional coupler 1505_1. The wideband circulator/directional coupler 1505_1 directs the combined reflected first through last microwave signals (respectively at readout resonator frequencies of readout resonator 1555_1 through 1555_N) to the wideband quantum-limited amplifier 350.

The process of driving the qubits with microwave signals (as qubit drive/control pulses) is the same as in FIG. 16 and is not repeated in FIG. 17. The internal details of the superconducting microwave signal distributor 1000_1 can be found in the discussion of the superconducting microwave signal distributor/combiner device 1000 discussed in FIGS. 10-14.

The technical benefits of FIG. 17 (e.g., using the superconducting lossless and matched signal distributor device 1000) over FIGS. 15 and 16 include 1) simultaneous readout of the readout resonators, and 2) no need to route outgoing readout and qubit pulses to different paths. The tradeoff of using the system 1700 (as opposed to the system 1500) is twice (2×) the number of input lines, twice (2×) the number of circulators, and twice (2×) the number 1-N quantum switches/routers.

Figure 18:
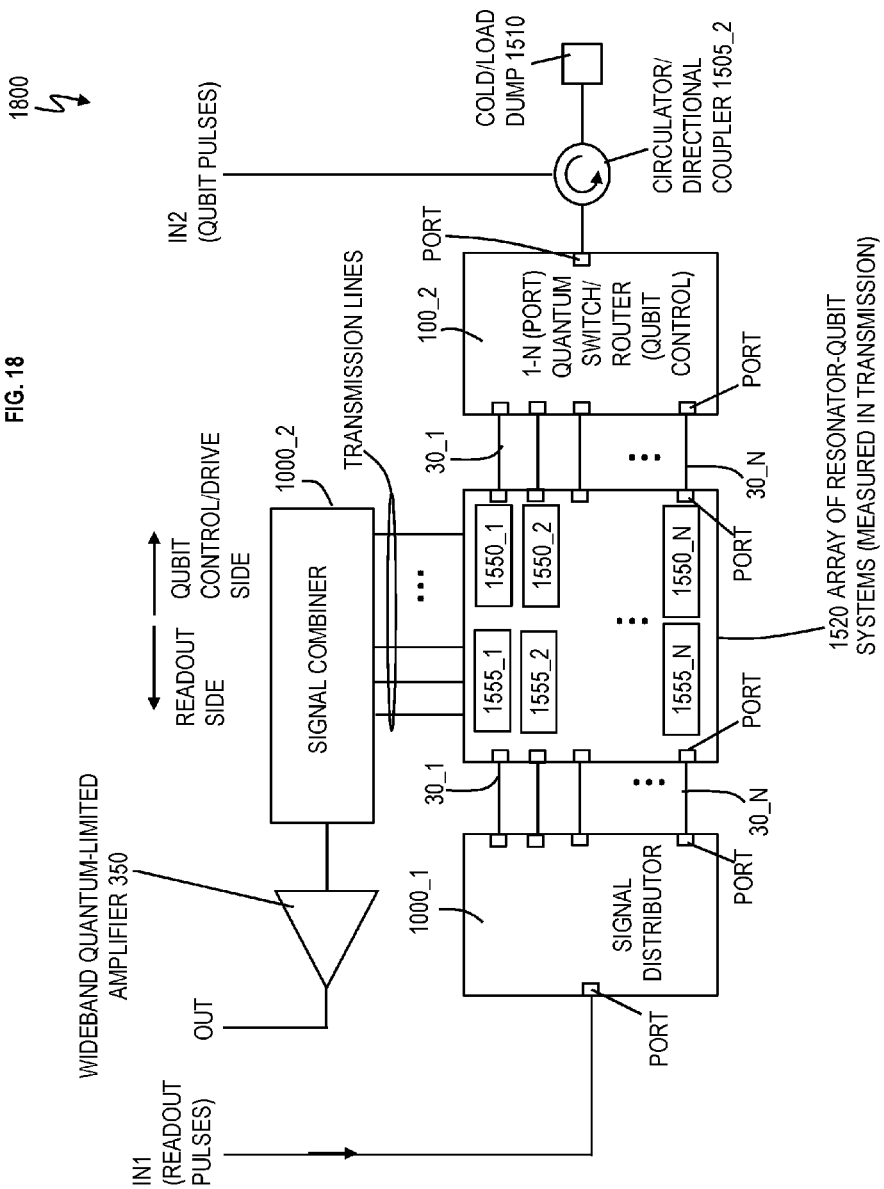
FIG. 18 is a system for qubit drive and qubit readout according to one or more embodiments.

FIG. 18 is a system 1800 for (both) qubit drive and qubit readout according to one or more embodiments. The system 1800 illustrates readout in transmission mode. The system 1800 has different input and output (I/O) lines (i.e., transmission lines) for readout of the readout resonators (to read the qubits) with readout pulses and driving/control of the qubits with qubit pulses. The system 1800 can be identical to the system 1700 except in system 1800 the readout to measure the qubits is in transmission using a second lossless and matched signal combiner device (which uses frequency-division multiplexing).

In the system 1700 of FIG. 17, the reflected microwave signals (as the readout signals) are transmitted back through the microwave signal distributor device 1000_1. However, in FIG. 18, the microwave signals as the readout signals (at the readout resonator frequencies) are transmitted to a microwave signal combiner device 1000_2, which combines each of the transmitted microwave signals at the readout resonator frequencies and outputs the combined microwave signals to the wideband quantum-limited amplifier 350 for amplification and later measurement.

Because input at input IN2 of the microwave signals as qubit control/drive pulses for qubits 1550 and the reflection of the microwave signals for the qubit control/drive pulses are the same as discussed in FIGS. 16 and 17, discussion of the qubit drive/control is not repeated in FIG. 18.

An example of readout in transmission mode is now discussed in FIG. 18. In the system 1800, the first through last microwave signals at the readout resonator frequencies (of readout resonators 1555_1 through 1555_N) can all be simultaneously applied via frequency-division multiplexing at input IN1 on the readout side. The first through last microwave signals at the readout resonator frequencies (of readout resonators 1555_1 through 1555_N) are directed to the wideband circulator/directional coupler 1505_1, which directs the first through last microwave signals at the readout resonator frequencies (of readout resonators 1555_1 through 1555_N) to the signal distributor device 1000_1, as discussed above. The signal distributor device 1000_1 is configured to utilize frequency-division multiplexing to (simultaneously) receive the different readout resonator frequencies for different microwave signals on a single port and is configured to (simultaneously) distribute the first through last microwave signals (according to their readout resonator frequencies of readout resonators 1555_1 through 1555_N) onto multiple transmission lines 30_1 through 30_N connected to the array of resonator-qubit system 1520. The individual bandpass filters 105_1 through 105_N of the signal distributor device 1000_1 are respectively connected (via ports) to transmission lines 30_1 through 30_N (on the readout side), such that bandpass filter 105_1 is connected to transmission line 30_1 (on the readout side) through bandpass filter 105_N connected to transmission line 30_N (on the readout side). Accordingly, in parallel, the signal distributor device 1000_1 is configured to direct the first microwave signal having the readout resonator frequency of readout resonator 1555_1 to the readout resonator 1555_1 via transmission line 30_1, to direct the second microwave signal having the readout resonator frequency of readout resonator 1555_2 to the readout resonator 1555_2 via transmission line 30_2, and to direct the last microwave signal having the readout resonator frequency of readout resonator 1555_N to the readout resonator 1555_N via transmission line 30_N. This is because each of the bandpass filters 105 are individually configured, in advance, to pass an individual one of the readout resonator frequencies matching an individual one of the readout resonators 1555 for microwave signals, such that bandpass filter 105_1 is configured to pass the first microwave signal at the readout frequency of readout resonator 1555_1, bandpass filter 105_2 is configured to pass the second microwave signal at the readout frequency of readout resonator 1555_2, through bandpass filter 105_N is configured to pass the last microwave signal at the readout frequency of readout resonator 1555_N. Accordingly, each first through last microwave signal respectively at a readout resonator frequency of readout resonators 1555_1 through 1555_N causes its respective one of the readout resonator 1555_1 through 1555_N to resonate, thereby (simultaneously) transmitting the first through the last microwave signals up through transmission lines to reach the signal distributor device 1000_2. The signal distributor device 1000_2 combines the first through last microwave signals (of the respective readout resonator frequencies of readout resonator 1555_1 through 1555_N) and (simultaneously) outputs the combined reflected microwave signals on a single transmission line to the wideband quantum-limited amplifier 350 for amplification and later measurement.

The internal details of the superconducting microwave signal distributor/contributor 1000_1 and 1000_2 can be found in the discussion of the superconducting microwave signal distributor/combiner device 1000 discussed in FIGS. 10-14.

Technical benefits of using the system 1800 in FIG. 18 include 1) simultaneous readout of the readout resonators and 2) no need for circulators on the readout side.

Figure 19:
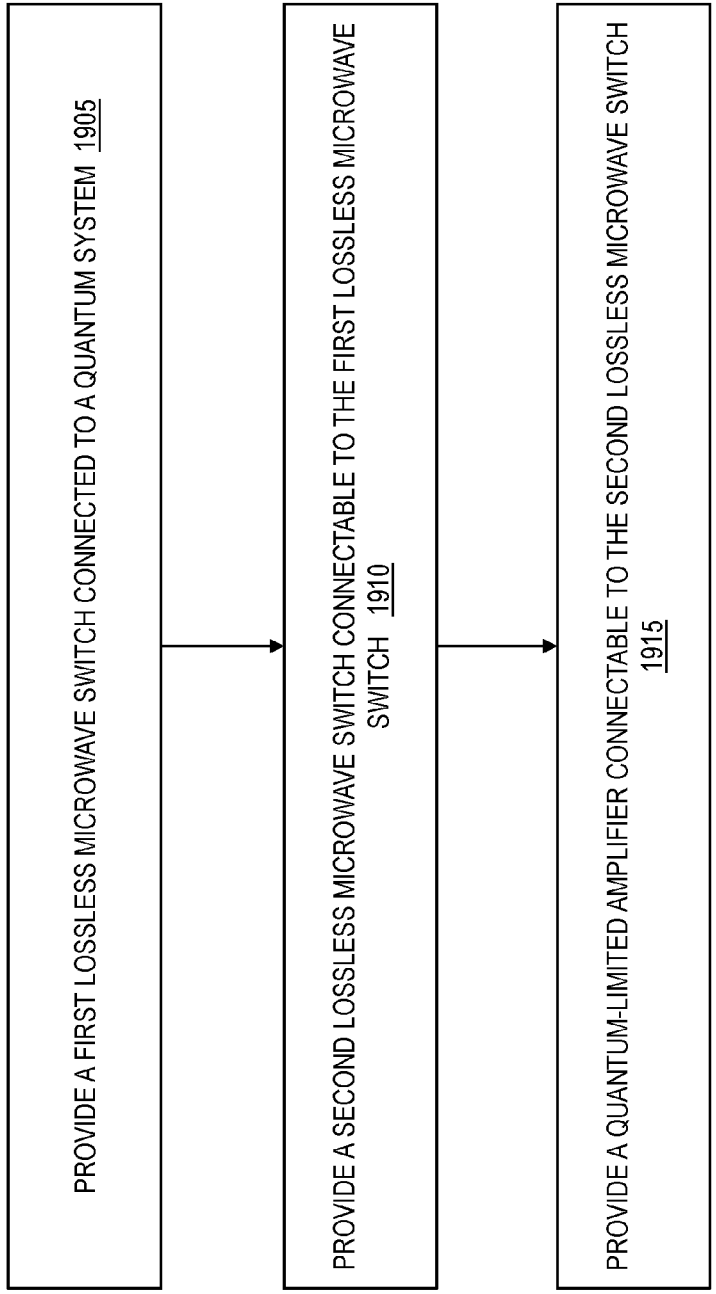
FIG. 19 is a flow chart of a method of configuring a system in FIG. 15 for qubit drive and readout according to one or more embodiments.

FIG. 19 is a flow chart 1900 of a method of configuring a system 1500 for qubit drive and readout according to one or more embodiments. At block 1905, a first lossless microwave switch 100_1 (in FIG. 15) is connected to a quantum system (e.g., the array of resonator-qubit systems 1520). At block 1910, a second lossless microwave switch 100_2 (in FIG. 15) is connectable to the first lossless microwave switch 100_1. At block 1915, a quantum-limited amplifier 350 is connectable to the second lossless microwave switch 100_2.

A circulator 1505 is configured to connect the first lossless microwave switch 100_1 to the second lossless microwave switch 100_2 in FIG. 15. The circulator 1505 is configured to connect an input IN1 to the first lossless microwave switch 100_1. The second lossless microwave switch 100_2 is configured to select between connecting to the quantum-limited amplifier 350 and connecting to a load dump 1510 in FIG. 15. The quantum system (e.g., the array of resonator-qubit systems 1520) includes a first qubit 1550_1 connected to a first readout resonator 1555_1 at a first port, a second qubit 1550_2 connected to a second readout resonator 1555_2 at a second port, through a last qubit 1550_N connected to a last readout resonator 1555_N at a last port, each of the first through the last qubits 1550_1-1550_N respectively having a first though last qubit frequency.

FIG. 20 is a flow chart 2000 of a method of configuring a system 1600 for qubit drive and readout according to one or more embodiments. At block 2005, a first lossless microwave switch 100_1 is connected to a quantum system (e.g., the array of resonator-qubit systems 1520), where a first input IN1 is connectable to the first lossless microwave switch 100_1 and a quantum-limited amplifier 350 is connectable to the first lossless microwave switch 100_1 in FIG. 16. At block 2010, a second lossless microwave switch 100_2 connected to the quantum system (e.g., the array of resonator-qubit systems 1520), where a second input IN2 is connectable to the second lossless microwave switch 100_2, where the second input IN2 is configured to drive the quantum system and the first input IN1 is configured to read out the quantum system, in FIG. 16.

Referring to FIG. 16, a first circulator 1505_1 is configured to connect the first input IN1 to the first lossless microwave switch 100_1 and configured to connect the quantum-limited amplifier 350 to the first lossless microwave switch 100_1. A second circulator 1505_2 is configured to connect the second input IN2 to the second lossless microwave switch 100_2 and connect a load dump 1510 to the second lossless microwave switch 100_2 in FIG. 16. The quantum system (e.g., the array of resonator-qubit systems 1520) includes a first qubit 1550_1 connected to a first readout resonator 1555_1 at a first port, a second qubit 1550_2 connected to a second readout resonator 1555_2 at a second port, through a last qubit 1550_N connected to a last readout resonator 1555_N at a last port, each of the first through the last qubits 1550_1-1550_N respectively having a first though last qubit frequency. The first through last qubit 1550_1-1550_N is driven via the second lossless microwave switch 100_2, and the first through last readout resonator 1555_1-1555_N is read out via the first lossless microwave switch 100_1.

FIG. 21 is a flow chart 2100 of a method of configuring a system 1700 for qubit drive and readout according to one or more embodiments. At block 2105, a lossless microwave signal distributor 1000_1 is connected to a quantum system (e.g., the array of resonator-qubit systems 1520), where a first input IN1 is connectable to the lossless microwave signal distributor 1000_1 in FIG. 17. At block 2110, a lossless microwave switch 100_2 is connected to the quantum system (e.g., the array of resonator-qubit systems 1520), where a second input IN2 is connectable to the lossless microwave switch 100_2. The second input IN2 is configured to drive the quantum system (e.g., the array of resonator-qubit systems 1520) via the lossless microwave switch 100_2, and the first input IN1 is configured to read out the quantum system via the lossless microwave signal distributor 1000_1.

A first circulator 1505_1 is configured to connect the first input IN1 to the lossless microwave signal distributor 1000_1 and configured to connect a quantum-limited amplifier 350 to the lossless microwave signal distributor 1000_1 in FIG. 17. A second circulator 1505_2 is configured to connect the second input IN2 to the lossless microwave switch 100_2 and connect a load dump 1510 to the lossless microwave switch 100_2. The quantum system (e.g., the array of resonator-qubit systems 1520) includes a first qubit 1550_1 connected to a first readout resonator 1555_1 at a first port, a second qubit 1550_2 connected to a second readout resonator 1555_2 at a second port, through a last qubit 1550_N connected to a last readout resonator 1555_N at a last port, each of the first through the last qubits 1550_1-1550_N respectively having a first though last qubit frequency. The first through last qubit 1550_1-1550_N is driven via the lossless microwave switch 100_2, while the first through last readout resonator 1555_1-1555_N is read out via the lossless microwave signal distributor 1000_1.

FIG. 22 is a flow chart 2200 of method for configuring a system 1800 for qubit drive and readout according to one or more embodiments. At block 2205, a lossless microwave signal distributor 1000_1 is connected to a quantum system (e.g., the array of resonator-qubit systems 1520), where a first input IN1 is connected to the lossless microwave signal distributor 1000_1 in FIG. 18. At block 2210, a lossless microwave switch 100_2 is connected to the quantum system (e.g., the array of resonator-qubit systems 1520), where a second input IN2 is connectable to the lossless microwave switch 100_2 in FIG. 18. The second input IN2 is configured to drive the quantum system via the lossless microwave switch 100_2. At block 2215, a lossless microwave signal combiner 1000_2 is connected to the quantum system, where the first input IN1 is configured to read out the quantum system via the lossless microwave signal distributor 1000_1 and the lossless microwave signal combiner 1000_2 in FIG. 18.

A quantum-limited amplifier 350 is connected to the lossless microwave signal combiner 1000_2 to amplify the transmitted microwave signals of the readout pulses. A circulator 1505_2 is configured to connect the second input IN2 to the lossless microwave switch 100_2 and connect a load dump 1510 to the lossless microwave switch 100_2 in FIG. 18. The quantum system (e.g., the array of resonator-qubit systems 1520) includes a first qubit 1550_1 connected to a first readout resonator 1555_1 at a first port, a second qubit 1550_2 connected to a second readout resonator 1555_2 at a second port, through a last qubit 1550_N connected to a last readout resonator 1555_N at a last port, each of the first through the last qubits 1550_1-1550_N respectively having a first though last qubit frequency. The first through last qubit 1550_1-1550_N is driven via the lossless microwave switch 100_2. Each of the first through last readout resonator 1555_1-1555_N can be read out simultaneously via the lossless microwave signal distributor 1000_1 and the lossless microwave signal combiner 1000_2.

The term "about" and variations thereof are intended to include the degree of error associated with measurement of the particular quantity based upon the equipment available at the time of filing the application. For example, "about" can include a range of ±8% or 5%, or 2% of a given value.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments discussed herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments discussed herein.

What is claimed is:

1. A system for qubit drive and readout, the system comprising:
   a lossless microwave signal distributor connected to a quantum system, wherein a first input line is connectable to the lossless microwave signal distributor;
   a lossless microwave switch connected to the quantum system, wherein a second input line is connectable to the lossless microwave switch, wherein the second input line is configured to drive the quantum system via the lossless microwave switch and the first input line is configured to read out the quantum system via the lossless microwave signal distributor;
   a first circulator configured to connect the first input to the lossless microwave signal distributor and configured to connect a quantum-limited amplifier to the lossless microwave signal distributor.

2. The system of claim 1, wherein a second circulator is configured to connect the second input to the lossless microwave switch.

3. The system of claim 2, wherein the second circulator is configured to connect a load dump to the lossless microwave switch.

4. The system of claim 1, wherein the quantum system includes a first qubit connected to a first readout resonator at a first port, a second qubit connected to a second readout resonator at a second port, through a last qubit connected to a last readout resonator at a last port, each of the first through the last qubits respectively having a first though last qubit frequency.

5. The system of claim 4, wherein the first through the last qubit is driven via the lossless microwave switch.

6. The system of claim 4, wherein the first through the last readout resonator is read out via the lossless microwave signal distributor.

7. A method of configuring a qubit drive and readout system, the method comprising:
   providing a lossless microwave signal distributor connected to a quantum system, wherein a first input line is connectable to the lossless microwave signal distributor;
   providing a lossless microwave switch connected to the quantum system, wherein a second input line is connectable to the lossless microwave switch, wherein the second input line is configured to drive the quantum system via the lossless microwave switch and the first input line is configured to read out the quantum system via the lossless microwave signal distributor; and
   arranging a first circulator configured to connect the first input to the lossless microwave signal distributor and configured to connect a quantum-limited amplifier to the lossless microwave signal distributor.

8. The method of claim 7, wherein a second circulator is configured to connect the second input to the lossless microwave switch.

9. The method of claim 8, wherein the second circulator is configured to connect a load dump to the lossless microwave switch.

10. The method of claim 7, wherein the quantum system includes a first qubit connected to a first readout resonator at a first port, a second qubit connected to a second readout resonator at a second port, through a last qubit connected to a last readout resonator at a last port, each of the first through the last qubits respectively having a first though last qubit frequency.

11. The method of claim 10, wherein the first through the last qubit is driven via the lossless microwave switch.

12. The method of claim 10, wherein the first through the last readout resonator is read out via the lossless microwave signal distributor.

13. A system for qubit drive and readout, the system comprising:

a lossless microwave signal distributor connected to a quantum system, wherein a first input line is connected to the lossless microwave signal distributor;

a lossless microwave switch connected to the quantum system, wherein a second input line is connectable to the lossless microwave switch, wherein the second input line is configured to drive the quantum system via the lossless microwave switch;

a lossless microwave signal combiner connected to the quantum system, wherein the first input line is configured to read out the quantum system via the lossless microwave signal distributor and the lossless microwave signal combiner; and a quantum-limited amplifier connected to the lossless microwave signal combiner.

14. The system of claim 13, wherein a circulator is configured to connect the second input to the lossless microwave switch and connect a load dump to the lossless microwave switch.

15. The system of claim 13, wherein the quantum system includes a first qubit connected to a first readout resonator at a first port, a second qubit connected to a second readout resonator at a second port, through a last qubit connected to a last readout resonator at a last port, each of the first through the last qubits respectively having a first though last qubit frequency.

16. The system of claim 15, wherein the first through the last qubit is driven via the lossless microwave switch.

17. The system of claim 15, wherein each of the first through the last readout resonator is read out simultaneously via the lossless microwave signal distributor and the lossless microwave signal combiner.

* * * * *